(12) United States Patent
Hegblom et al.

(10) Patent No.: US 12,126,145 B2
(45) Date of Patent: Oct. 22, 2024

(54) BOTTOM-EMITTING VERTICAL CAVITY SURFACE EMITTING LASER ARRAY WITH INTEGRATED DIRECTED BEAM DIFFUSER

(71) Applicant: Lumentum Operations LLC, San Jose, CA (US)

(72) Inventors: Eric R. Hegblom, Sunnyvale, CA (US); Kevin Wang, Fremont, CA (US)

(73) Assignee: Lumentum Operations LLC, San Jose, CA (US)

( * ) Notice: Subject to any disclaimer, the term of this patent is extended or adjusted under 35 U.S.C. 154(b) by 828 days.

(21) Appl. No.: 17/247,737

(22) Filed: Dec. 21, 2020

(65) Prior Publication Data

US 2021/0336424 A1    Oct. 28, 2021

Related U.S. Application Data

(60) Provisional application No. 63/014,483, filed on Apr. 23, 2020.

(51) Int. Cl.
*H01S 5/42* (2006.01)
*H01S 5/02253* (2021.01)
(Continued)

(52) U.S. Cl.
CPC .......... *H01S 5/423* (2013.01); *H01S 5/02253* (2021.01); *H01S 5/18305* (2013.01);
(Continued)

(58) Field of Classification Search
CPC .............. H01S 5/0071; H01S 5/02253; H01S 5/183–18397; H01S 5/426; H01S 5/18388; H01S 2301/18; H01S 5/42–423
See application file for complete search history.

(56) References Cited

U.S. PATENT DOCUMENTS 6,459,842 B1    10/2002  Arsenault et al.
6,549,556 B1    4/2003   Hwang et al.
(Continued)

FOREIGN PATENT DOCUMENTS

EP    3518356 A1 *  7/2019  .......... H01S 5/0207
WO   2020067995 A1   4/2020

OTHER PUBLICATIONS

Coldren et al., "Flip-chip Bonded VCSELs with Integrated Microlenses for Free-Space Optical Interconnects," Conference Proceedings, LEOS '97. 10th Annual Meeting IEEE Lasers and Electro-Optics Society 1997 Annual Meeting, San Francisco, CA, USA, 1997, pp. 343-344, vol. 1, doi: 10.1109/LEOS.1997.630657.
(Continued)

*Primary Examiner* — Sean P Hagan
(74) *Attorney, Agent, or Firm* — Harrity & Harrity, LLP

(57) ABSTRACT

A bottom-emitting vertical-cavity surface-emitting laser (VCSEL) chip may include a VCSEL array including plurality of VCSELs and an integrated optical element including a plurality of lens segments. The integrated optical element may direct beams provided by the plurality of VCSELs to a particular range of angles to create a diffusion pattern using the beams provided by the plurality of VCSELs. A surface of a first lens segment may be sloped to cause a beam from a first VCSEL to be steered at a first angle and a surface of a second (adjacent) lens segment may be sloped to cause a beam from a second VCSEL to be steered at a second angle. A direction of the second angle with respect to a surface of the VCSEL array may be opposite to a direction of the first angle with respect to the surface of the VCSEL array.

20 Claims, 19 Drawing Sheets

(51) Int. Cl.
  *H01S 5/183*   (2006.01)
  *H01S 5/0234*  (2021.01)
  *H01S 5/042*   (2006.01)

(52) U.S. Cl.
  CPC ......... *H01S 5/0234* (2021.01); *H01S 5/04257* (2019.08); *H01S 2301/18* (2013.01)

(56) References Cited

U.S. PATENT DOCUMENTS

| | | |
|---|---|---|
| 6,816,523 B1 | 11/2004 | Glenn et al. |
| 6,836,321 B2 | 12/2004 | DeFelice et al. |
| 6,943,875 B2 | 9/2005 | DeFelice et al. |
| 6,953,291 B2 | 10/2005 | Liu |
| 7,020,362 B2 | 3/2006 | Simon et al. |
| 7,061,956 B2 | 6/2006 | Eitel |
| 7,324,717 B2 | 6/2008 | Chua et al. |
| 7,835,410 B2 | 11/2010 | Guenter et al. |
| 7,949,024 B2 | 5/2011 | Joseph |
| 8,412,052 B2 | 4/2013 | Mohammed |
| 8,613,536 B2 | 12/2013 | Joseph et al. |
| 8,675,701 B2 | 3/2014 | Guenter et al. |
| 8,749,796 B2 | 6/2014 | Pesach et al. |
| 8,848,757 B2 | 9/2014 | Joseph |
| 8,979,338 B2 | 3/2015 | Joseph |
| 8,995,485 B2 | 3/2015 | Joseph et al. |
| 8,995,493 B2 | 3/2015 | Joseph et al. |
| 9,065,239 B2 | 6/2015 | Joseph et al. |
| 9,184,855 B2 | 11/2015 | Guenter et al. |
| 9,232,592 B2 | 1/2016 | Lear |
| 9,268,012 B2 | 2/2016 | Ghosh et al. |
| 9,275,969 B2 | 3/2016 | Eid et al. |
| 9,553,423 B2 | 1/2017 | Chen et al. |
| 9,728,934 B2 | 8/2017 | Wang et al. |
| 9,740,019 B2 | 8/2017 | Mor |
| 9,746,369 B2 | 8/2017 | Shpunt et al. |
| 9,800,015 B2 | 10/2017 | Eid et al. |
| 9,825,425 B2 | 11/2017 | Mor |
| 10,038,304 B2 | 7/2018 | Joseph |
| 10,054,430 B2 | 8/2018 | Mor et al. |
| 10,072,815 B2 | 9/2018 | MacKinnon et al. |
| 10,135,222 B2 | 11/2018 | Hogan et al. |
| 10,153,615 B2 | 12/2018 | Joseph |
| 10,177,527 B2 | 1/2019 | Dummer et al. |
| 10,244,181 B2 | 3/2019 | Warren |
| 10,288,417 B2 | 5/2019 | Mor et al. |
| 10,295,145 B2 | 5/2019 | MacKinnon et al. |
| 10,333,277 B2 | 6/2019 | Wan et al. |
| 10,551,178 B2 | 2/2020 | Mor et al. |
| 10,571,709 B2 | 2/2020 | Mor |
| 10,615,871 B2 | 4/2020 | Joseph et al. |
| 10,630,053 B2 | 4/2020 | Joseph |
| 10,630,055 B2 | 4/2020 | Joseph |
| 10,690,488 B2 | 6/2020 | Pesach et al. |
| 10,749,312 B2 | 8/2020 | Hogan et al. |
| 2002/0093024 A1* | 7/2002 | Lee .................... H01S 5/18388 257/98 |
| 2002/0104959 A1 | 8/2002 | Arsenault et al. |
| 2002/0196431 A1 | 12/2002 | DeFelice et al. |
| 2003/0231682 A1 | 12/2003 | Eitel |
| 2004/0233451 A1 | 11/2004 | DeFelice et al. |
| 2004/0264884 A1 | 12/2004 | Liu |
| 2006/0088254 A1 | 4/2006 | Mohammed |
| 2007/0126010 A1 | 6/2007 | Chua et al. |
| 2008/0187013 A1 | 8/2008 | Guenter et al. |
| 2010/0303113 A1 | 12/2010 | Joseph |
| 2011/0057128 A1 | 3/2011 | Guenter et al. |
| 2011/0148328 A1 | 6/2011 | Joseph et al. |
| 2011/0176567 A1 | 7/2011 | Joseph |
| 2013/0038881 A1 | 2/2013 | Pesach et al. |
| 2013/0266326 A1* | 10/2013 | Joseph ............... H04B 10/1141 398/130 |
| 2013/0272330 A1 | 10/2013 | Joseph et al. |
| 2013/0278151 A1 | 10/2013 | Lear |
| 2014/0079088 A1 | 3/2014 | Joseph |
| 2014/0169800 A1 | 6/2014 | Eid et al. |
| 2014/0197338 A1 | 7/2014 | Guenter et al. |
| 2015/0063387 A1 | 3/2015 | Joseph et al. |
| 2015/0340841 A1 | 11/2015 | Joseph |
| 2015/0362585 A1 | 12/2015 | Ghosh et al. |
| 2016/0080077 A1 | 3/2016 | Joseph et al. |
| 2016/0164261 A1* | 6/2016 | Warren ................. H04N 23/11 372/50.122 |
| 2016/0178915 A1 | 6/2016 | Mor et al. |
| 2016/0254641 A1 | 9/2016 | Eid et al. |
| 2016/0352071 A1 | 12/2016 | Hogan et al. |
| 2016/0352073 A1 | 12/2016 | Dummer et al. |
| 2016/0352074 A1* | 12/2016 | Hogan ................. H01S 5/4043 |
| 2017/0003122 A1 | 1/2017 | Pesach et al. |
| 2017/0063035 A1 | 3/2017 | Wang et al. |
| 2017/0370554 A1 | 12/2017 | MacKinnon et al. |
| 2018/0231373 A1 | 8/2018 | Pesach et al. |
| 2018/0292200 A1 | 10/2018 | Mor et al. |
| 2019/0017678 A1 | 1/2019 | MacKinnon et al. |
| 2019/0052365 A1 | 2/2019 | Joseph et al. |
| 2019/0131771 A1 | 5/2019 | Wan et al. |
| 2019/0226838 A1 | 7/2019 | Mor et al. |
| 2019/0268068 A1 | 8/2019 | Dacha et al. |
| 2019/0356383 A1 | 11/2019 | Joseph |
| 2020/0067264 A1 | 2/2020 | Guo et al. |
| 2020/0194973 A1* | 6/2020 | Bloemen ............ H01S 5/18388 |
| 2020/0194975 A1* | 6/2020 | Gronenborn ........ H01S 5/02253 |
| 2020/0235809 A1 | 7/2020 | Joseph et al. |
| 2020/0235810 A1 | 7/2020 | Joseph et al. |
| 2020/0235811 A1 | 7/2020 | Joseph et al. |
| 2020/0244039 A1* | 7/2020 | Kondo ................. H01S 5/0261 |

OTHER PUBLICATIONS

Strzelecka et al., "Multiple-Wavelength MBE-Regrown Vertical-Cavity Laser Arrays Intergrated with Refractive Microlenses for Optical Interconnections" Conference Digest. 15th IEEE International Semiconductor Laser Conference, Haifa, Israel, 1996, pp. 87-88, vol. 1, doi: 10.1109/ISLC.1996.553760.

Strzelecka et al., "Monolithic intergration of vertical-cavity laser diodes with refractive GaAs microlenses," Electronic Letters, Apr. 27, 1995, vol. 31 No. 9, pp. 724-725.

* cited by examiner

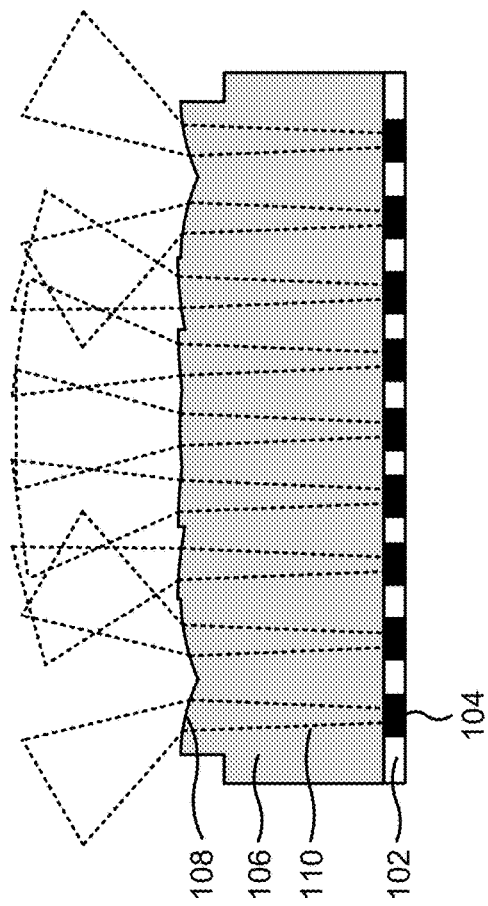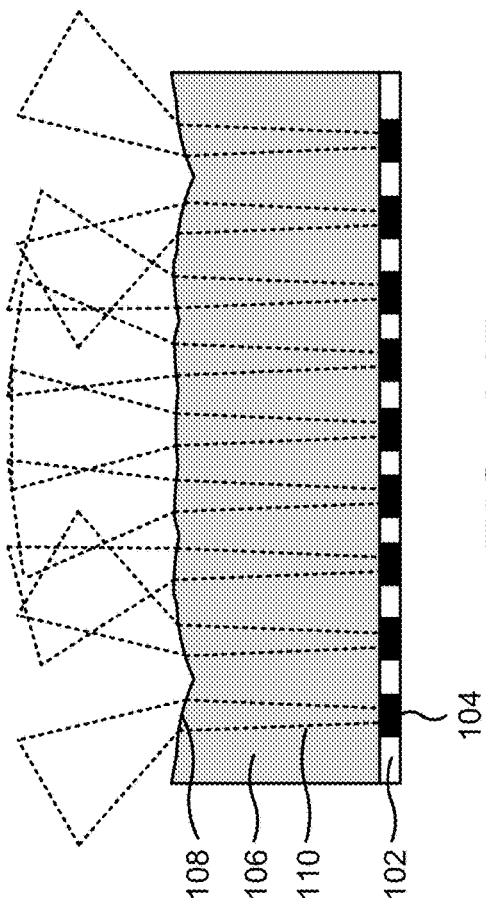

BOTTOM-EMITTING VERTICAL CAVITY SURFACE EMITTING LASER ARRAY WITH INTEGRATED DIRECTED BEAM DIFFUSER

CROSS-REFERENCE TO RELATED APPLICATION

This Patent Application claims priority to U.S. Provisional Patent Application No. 63/014,483, filed on Apr. 23, 2020, and entitled "BOTTOM-EMITTING VERTICAL CAVITY SURFACE EMITTING LASER ARRAY WITH INTEGRATED DIRECTED BEAM DIFFUSER." The disclosure of the prior Application is considered part of and is incorporated by reference into this Patent Application.

TECHNICAL FIELD

The present disclosure relates generally to a vertical-cavity surface-emitting laser (VCSEL) array and to a bottom-emitting VCSEL array with an integrated directed beam diffuser.

BACKGROUND

A VCSEL array can be used to illuminate a scene for use in, for example, a three-dimensional (3D) sensing application. Conventionally, the VCSEL array is paired with a diffuser that is external to the VCSEL array. The diffuser may act to spread light provided by emitters of the VCSEL over a field-of-view (FOV) also sometimes referred to as the field of illumination (FOI). In the conventional arrangement of an external diffuser and a VCSEL array, the diffuser spreads light from a given VCSEL over the entire FOV. Put another way, a diffuser response does not vary from emitter-to-emitter across the VCSEL array.

SUMMARY

In some implementations, a bottom-emitting VCSEL chip includes a VCSEL array including plurality of VCSELs; and an integrated optical element including a plurality of lens segments, wherein the integrated optical element is to direct beams provided by the plurality of VCSELs to a particular range of angles to create a diffusion pattern using the beams provided by the plurality of VCSELs, wherein a surface of a first lens segment of the plurality of lens segments is sloped to cause a beam from a first VCSEL of the plurality of VCSELs to be steered at a first angle, wherein a surface of a second lens segment of the plurality of lens segments is sloped to cause a beam from a second VCSEL of the plurality of VCSELs to be steered at a second angle, wherein the second lens segment is adjacent to the first lens segment, and wherein a direction of the second angle with respect to a surface of the VCSEL array is opposite to a direction of the first angle with respect to the surface of the VCSEL array, and wherein a beam from a VCSEL of the plurality of VCSELs is to pass through only one lens segment of the plurality of lens segments.

In some implementations, an optical device includes a VCSEL array including plurality of VCSELs; and an integrated optical element including a plurality of lens segments, wherein the integrated optical element is to direct beams provided by the plurality of VCSELs to a particular range of angles to create a diffusion pattern using the beams provided by the plurality of VCSELs, wherein a lens segment of the plurality of lens segments is to steer a beam from a VCSEL of the plurality of VCSELs at a respective particular angle in association with creating the diffusion pattern, and wherein surfaces of two adjacent lens segments of the plurality of lens segments are sloped to cause beams from two respective VCSELs of the plurality of VCSELs to be steered at angles having opposite directions with respect to a surface of the VCSEL array.

In some implementations, an optical device includes a VCSEL array including plurality of VCSELs; and an integrated optical element including a plurality of lens segments, wherein the integrated optical element is to direct beams provided by the plurality of VCSELs to a particular range of angles to create a diffusion pattern using the beams provided by the plurality of VCSELs, wherein light from a VCSEL of the plurality of VCSELs is present in a portion of the diffusion pattern that is less than an entirety of the diffusion pattern, and wherein surfaces of lens segments of the plurality of lens segments are sloped in alternating directions to cause beams from two or more respective VCSELs of the plurality of VCSELs to be steered at alternating angles with respect to a surface of the VCSEL array.

BRIEF DESCRIPTION OF THE DRAWINGS

FIGS. 14A and 14B are diagrams illustrating an example arrangement of lens segments that reduces abrupt changes in a profile of lens segments on an integrated optical element described herein.

DETAILED DESCRIPTION

Figure 1:
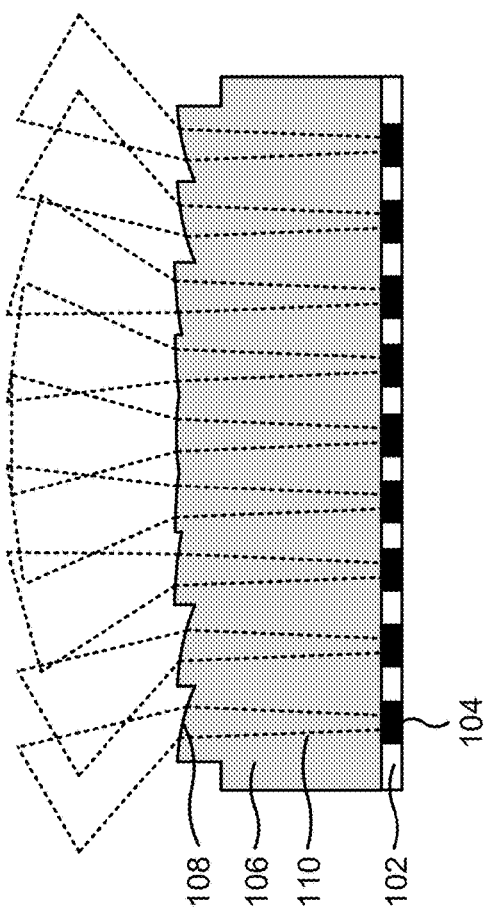
FIG. 1 is a diagram of an example optical device comprising an emitter array and an integrated directed beam diffuser described herein.

The following detailed description of example implementations refers to the accompanying drawings. The same reference numbers in different drawings may identify the same or similar elements.

A conventional diffuser is a discrete component arranged at a particular distance from a light source (e.g., a VCSEL) and acts to spread light from the light source over an entire FOV, as described above. Such arrangement and functionality may be beneficial when the light source is single-mode or few-mode such that interference spots are present (also referred to as as speckle). However, some emitters, such as VCSELs, may have lateral modes that change on a picosecond (or shorter) timescale, which significantly reduces speckle, meaning that a broad diffusion of light from a given VCSEL in a VCSEL array is not needed to obtain a sufficiently smooth pattern.

Further, a diffuser can be diffractive or refractive. Both of these types of diffusers suffer as a divergence of a VCSEL increases, which can result in an FOV efficiency of only approximately 70% to 80%. In addition to the FOV efficiency, light may be reflected by an incoming surface (e.g., a polymer surface) of the diffuser or by an exiting surface (e.g., a glass surface) of the diffuser, neither of which are typically anti-reflection (AR) coated (due to the difficulty of depositing an AR coating and keeping the AR coating in place). Without these AR coatings, efficiency is further reduced (e.g., by up to approximately another 8%). Furthermore, the diffuser needs micrometer or sub-micrometer scale features that are difficult or impossible to fabricate with photolithography, instead requiring an imprint from a mold. A mold can be significantly more expensive than a photomask and also does not lend itself to integration with VCSEL arrays that can change from product to product. Furthermore, for a diffractive diffuser, there is often excess unwanted light in a center of a diffusion pattern from a "zero-order" direction. For a refractive diffuser, there may not be a problem from zero-order diffraction, but there may be parasitic reflections at some angles, which reduces efficiency. This problem is worsened at an interface where light goes from a material with a high refractive index (e.g., a semiconductor material) to air. For these reasons, the use of a conventional discrete diffuser may be sub-optimal in an application that uses VCSELs as a light source.

Some implementations described herein provide a VCSEL chip having a bottom-emitting VCSEL array with an integrated optical element that acts as a directed beam diffuser (herein referred to as an integrated optical element). In some implementations, the integrated optical element includes a plurality of lens segments that, collectively, create a diffusion pattern from beams provided by VCSELs of a VCSEL array (e.g., such that an aggregate intensity versus angle from all of the VCSELs mimics an output of a conventional diffuser). In some implementations, the integrated optical element creates the diffusion pattern by directing beams provided by the VCSELs to a particular range of angles. In some implementations, a beam from a given VCSEL passes through only one lens segment of the integrated optical element. In some implementations, a lens segment steers the beam from the given VCSEL at a particular angle in association with creating the diffusion pattern. In some implementations, light from the given VCSEL is present in only a portion of the diffusion pattern. That is, the light from the given VCSEL is not spread over the entire diffusion pattern (as in the case of a conventional diffuser).

As described in further detail below, the VCSEL array with the integrated optical element overcomes the above-described drawbacks of the conventional diffuser. In this way, functionality of a discrete diffuser and VCSEL array can be combined in one compact chip while also improving efficiency of the optical system. Further, a chip having the VCSEL array with the integrated optical element enables independent illumination of different regions, which may be advantageous for some optical systems, such as an indirect time-of-flight system that needs high power to illuminate objects at greater distances.

FIG. 1 is a diagram of an example optical device 100 comprising an emitter array 102 and an integrated optical element 106. Optical device 100 may be, for example, a bottom-emitting VCSEL chip.

Emitter array 102 is an emitter array to provide light (e.g., beams 110) from which a diffusion pattern is to be created by integrated optical element 106. For example, as shown in FIG. 1, emitter array 102 may include a plurality of emitters 104, each of which is to provide a respective beam 110. In some implementations, emitter array 102 is a planar array having oxide trenches defining the plurality of emitters 104. In some implementations, emitter array 102 is a bottom-emitting VCSEL array comprising a plurality of bottom-emitting VCSELs (i.e., emitters 104 of emitter array 102 may emit light through a substrate-side of emitter array 102). In some implementations, emitter array 102 is a one-dimensional (1D) array of emitters 104. In some implementations, emitter array 102 is a two-dimensional (2D) array of emitters 104. In some implementations, emitter array 102 includes at least approximately 40 emitters 104 (e.g., emitter array 102 may include a few hundred emitters). In some implementations, the number of emitters 104 may be selected so as to enable a smooth intensity versus angle profile to be created (e.g., as compared to an array of distinct spots in the far-field). Notably, such a design also enables independent illumination of different portions of a FOV.

Integrated optical element 106 is a component to create a diffusion pattern from beams 110 provided by emitters 104 of emitter array 102. As shown in FIG. 1, integrated optical element 106 may include a plurality of lens segments 108. In some implementations, integrated optical element 106 is integrated with emitter array 102. That is, integrated optical element 106 is not a discrete or external diffuser. Rather, integrated optical element 106 is integrated in a chip with emitter array 102. For example, the plurality of lens segments 108 may be patterned on a substrate (e.g., a gallium arsenide (GaAs) substrate) of emitter array 102. In some implementations, the optical element 106 and emitter array 102 may be monolithically integrated into a wafer comprising a plurality of optical devices 100. In some implementations, integrated optical element 106 may form the substrate. In some implementations, integrated optical element 106 may be formed in the substrate of the emitter array 102. Thus, in some implementations, the lens segments 108 are formed on an exterior surface of the optical device 100. In some implementations, optical element 106 may have an anti-reflection coating deposited on the top surface.

In some implementations, a slope of a given lens segment 108 of integrated optical element 106 (e.g., relative to a surface of emitter array 102) can be selected so as to provide steering of a beam 110 at a particular angle. Thus, slopes of the lens segments 108 of integrated optical element 106 can be selected so as to cause integrated optical element 106 to create a desired diffusion pattern from beams 110 provided by emitters 104 of emitter array 102.

In some implementations, a surface of a lens segment 108 of integrated optical element 106 may be planar (e.g., a surface having a linear slope). A lens segment 108 having a sloped planar surface may provide steering of beam 110 but may not reduce divergence of the beam 110. In some implementations, a surface of a lens segment 108 of integrated optical element 106 may be curved (e.g., a surface may have a non-linear slope, as illustrated in FIG. 1). In some implementations, curvature of a surface of lens segment 108 may act to reduce divergence of a beam 110 passing through the lens segment 108, which may be beneficial at, for example, comparatively steeper angles (e.g., to improve sharpness of the intensity versus angle profile at the edge of the diffusion pattern where the beam may exit at 20 to 60 degrees from normal and the surface may be tilted nominally 7 to 14 degrees from horizontal). In some implementations, a radius of curvature of the given lens segment 108 may be in a range from approximately 180 micrometers (μm) to approximately 450 μm (e.g., to obtain reasonable tolerance to misalignment, which may be in the range of approximately ±1 μm to approximately ±5 μm). In some implementations, a slope of a surface of a lens segment 108 may be selected so as to steer a beam 110 passing through the lens segment 108 in a desired direction. In some implementations, a type of the surface (e.g., curved, planar) of a given lens segment 108 may be selected so as to selectively reduce divergence of a beam 110 passing through the given lens segment 108. In some implementations, reducing the divergence of beams 110 that illuminate edges of the FOV may improve sharpness in edges of an aggregate profile of the diffusion pattern created by integrated optical element 106. In some implementations, the lens segments 108 may each correspond to segments of a same reference lens or may each correspond to segments from a set of two or three reference lenses.

In some implementations, a pitch (e.g., a center-to-center distance) between a given pair of lens segments 108 is in a range from approximately 30 μm to approximately 60 μm and intended to match the pitch of the emitters. This pitch is much tighter compared to that for full (circular) lenses, which may be 100 μm to 200 μm. In some implementations, a size of a footprint of integrated optical element 106 matches or is smaller than a size of a footprint of emitter array 102. That is, in some implementations, a footprint of integrated optical element 106 is not larger than a footprint of emitter array 102.

As shown in FIG. 1, in operation, emitters 104 of emitter array 102 emit beams 110 through integrated optical element 106 such that each beam 110 passes through a respective lens segment 108. In some implementations, as illustrated in FIG. 1, optical device 100 is designed such that each beam 110 passes through a different lens segment 108 of integrated optical element 106 (i.e., such that no two beams 110 pass through the same lens segment 108). Alternatively, in some implementations, optical device 100 maybe designed such that two or more beams 110 pass through a given lens segment 108 of integrated optical element 106.

In some implementations, the lens segments 108 of integrated optical element 106 direct the beams 110 to a particular range of angles to create a diffusion pattern using the beams 110. To create the diffusion pattern, a given lens segment 108 steers a beam 110 from one or more emitters 104 at a particular angle (e.g., the particular angle depending on slope of a surface of the given lens segment 108). For example, as shown in FIG. 1, beams 110 provided by emitters 104 on a left side of emitter array 102 may be steered in generally leftward directions in association with generating the diffusion pattern. As shown in FIG. 1, beams 110 provided by emitters 104 on a right side of emitter array 102 may be steered in generally rightward direction in association with generating the diffusion pattern. As shown in FIG. 1, beams 110 provided by emitters 104 near a center of emitter array 102 may be steered in a generally straight direction in association with generating the diffusion pattern. As a result, as indicated in FIG. 1, light from a given emitter 104 is present in only a portion of the diffusion pattern created by integrated optical element 106 (i.e., light from the given emitter is not present across the entire diffusion pattern).

Notably, as illustrated in FIG. 1, a beam 110 from a given emitter 104 may pass through only one lens segment 108. In some implementations, optical device 100 may designed such that a combined output beam of optical device 100 mimics that of a conventional diffuser. That is, in some implementations, the diffusion pattern created by integrated optical element 106 may mimic that of the conventional external diffuser described above. In some implementations, optical device 100 is designed such that an aggregate intensity versus angle of the diffusion pattern minimizes an appearance of spots from individual emitters 104 in the diffusion pattern (e.g., such that intensity varies with oscillation of less than approximately 20% between inner angles of the diffusion pattern and outer angles of the diffusion pattern). In some implementations, optical device 100 is designed to maximize power concentrated within the FOV. To increase the power within a particular FOV, the edges of the profile need to be sharp with respect to angle. The optical device 100 designed with smaller emitters (e.g., 4 μm to 16 μm aperture diameter) and an optimal radius of curvature (e.g., for GaAs substrates a radius of 150 μm to 380 μm, generally 1.4× to 2.5× the substrate thickness) will better narrow the divergence and when pointed at the edge of the FOV will result in a sharper, more efficient profile. The radius of curvature and individual divergence may need to increase for emitters pointed towards the center of the FOV in order to smooth out the profile. Thicker substrates (e.g., thicknesses greater than 400 μm) and larger radii of curvature further reduce divergence, but require emitters spread further apart, which increases chip cost and may result in dispersion of the far-field profile into spots rather than a continuous beam of light.

As indicated above, FIG. 1 is provided as an example. Other examples may differ from what is described with regard to FIG. 1. Further, the number and arrangement of components shown in FIG. 1 are provided as an example. In practice, there may be additional components, fewer components, different components, or differently arranged components than those shown in FIG. 1.

Figure 2:
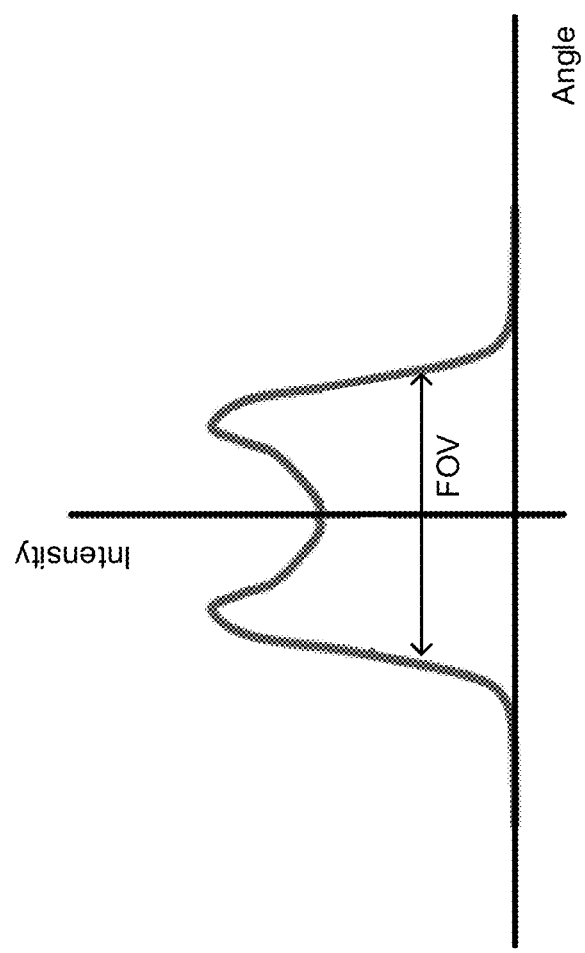
FIG. 2 is an illustrative example of a bat-wing profile that can be achieved by appropriate design of the optical device described herein.

In some implementations, optical device 100 is designed such that the diffusion pattern has a higher intensity (e.g., approximately two to four times a center intensity) at relatively larger angles within a desired FOV (e.g., a FOV from approximately 50 to approximately 120 degrees) to achieve a so-called "bat-wing" profile. FIG. 2 is an illustrative example of a bat-wing profile that can be achieved by appropriate design of optical device 100. FIG. 2 is provided as an example, and other examples may differ from what is described with regard to FIG. 2.

Figure 3:
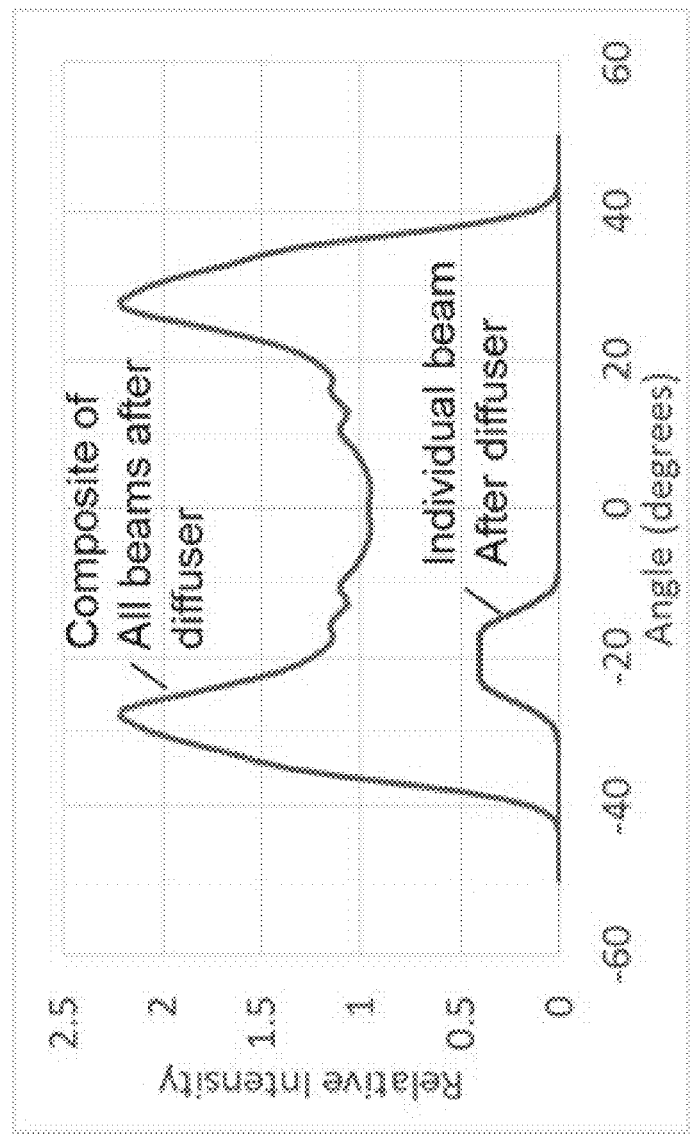
FIG. 3 is a diagram illustrating a composite relative intensity versus angle of an output of the optical device described herein, along with a relative intensity versus angle for an individual emitter.

FIG. 3 is a diagram illustrating a composite relative intensity versus angle (far-field) of an output of optical device 100 after integrated optical element 106 for all emitters 104 in an example emitter array 102 and a relative intensity versus angle after integrated optical element 106 for an individual emitter 104 of the example emitter array 102. As indicated in FIG. 3, in operation of optical device 100, a beam 110 of the individual emitter 104 is steered in a particular direction (as dictated by an associated lens segment 108). The other beams 110 emitted by other emitters 104 of emitter array 102 are similarly steered (at particular angles as dictated by their associated lens segments 108) so that the composite relative intensity versus angle is created from the beams 110 provided by the emitters 104. That is, a composite of intensity profiles associated with each emitter 104 of the example emitter array 102 would result in the composite relative intensity versus angle profile shown in FIG. 3.

Figure 4:
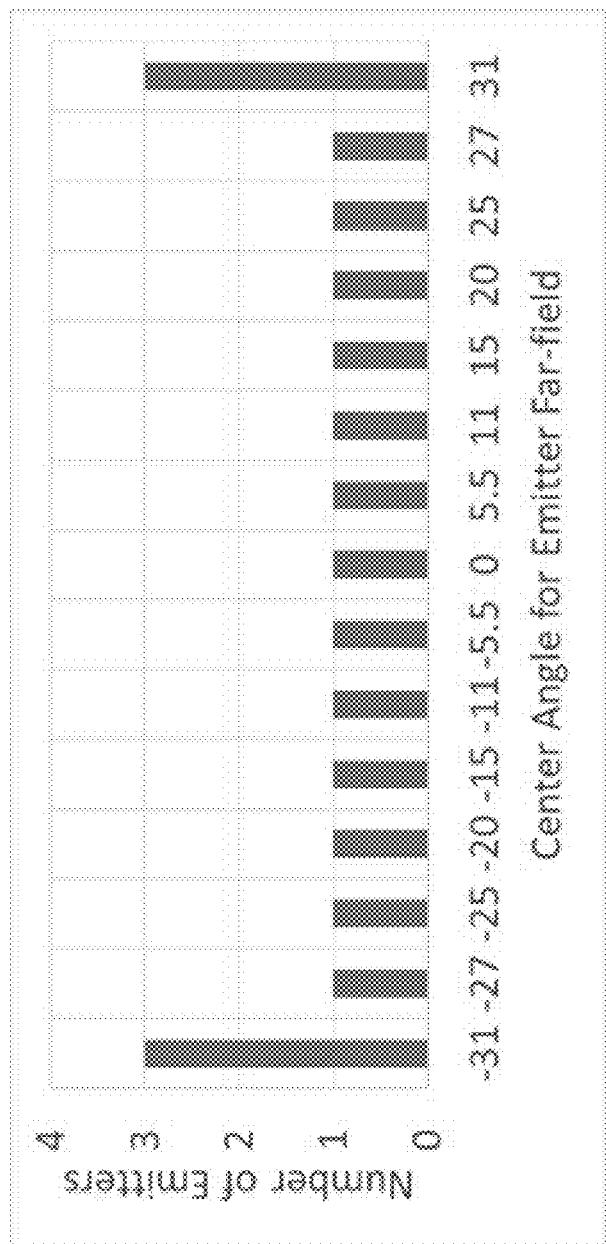
FIG. 4 is a diagram illustrating an example distribution of emitters designed to steer beams to various angles in association with creating the composite intensity versus angle shown in FIG. 3.

FIG. 4 is a diagram illustrating an example distribution of emitters 104 designed to steer beams 110 to various angles in association with creating the composite intensity versus angle shown in FIG. 3. In the example shown in FIG. 4, emitter array 102 has 19 emitters 104, and lens segments 108 of integrated optical element 106 direct the beams 110 to specific angles as given by the distribution shown in FIG. 4. In some implementations, as indicated in FIG. 4, there is a comparatively lower number of emitters 104 aimed toward a center of emitter array 102 (e.g., angles with a smaller absolute value). However, the number of emitters 104 aimed toward the center of emitter array 102 may not be so low such that individual beams 110 appear in the far-field. In some implementations, as shown in FIG. 4, the number of emitters 104 aimed to angles near edges of the FOV (e.g., angles with a higher absolute value) may be comparatively higher (e.g., to increase intensity near the edges of emitter array 102 in order to create the diffusion pattern having the bat-wing profile). As indicated above, FIGS. 3 and 4 are provided as examples. Other examples may differ from what is described with regards to FIGS. 3 and 4.

Figure 5:
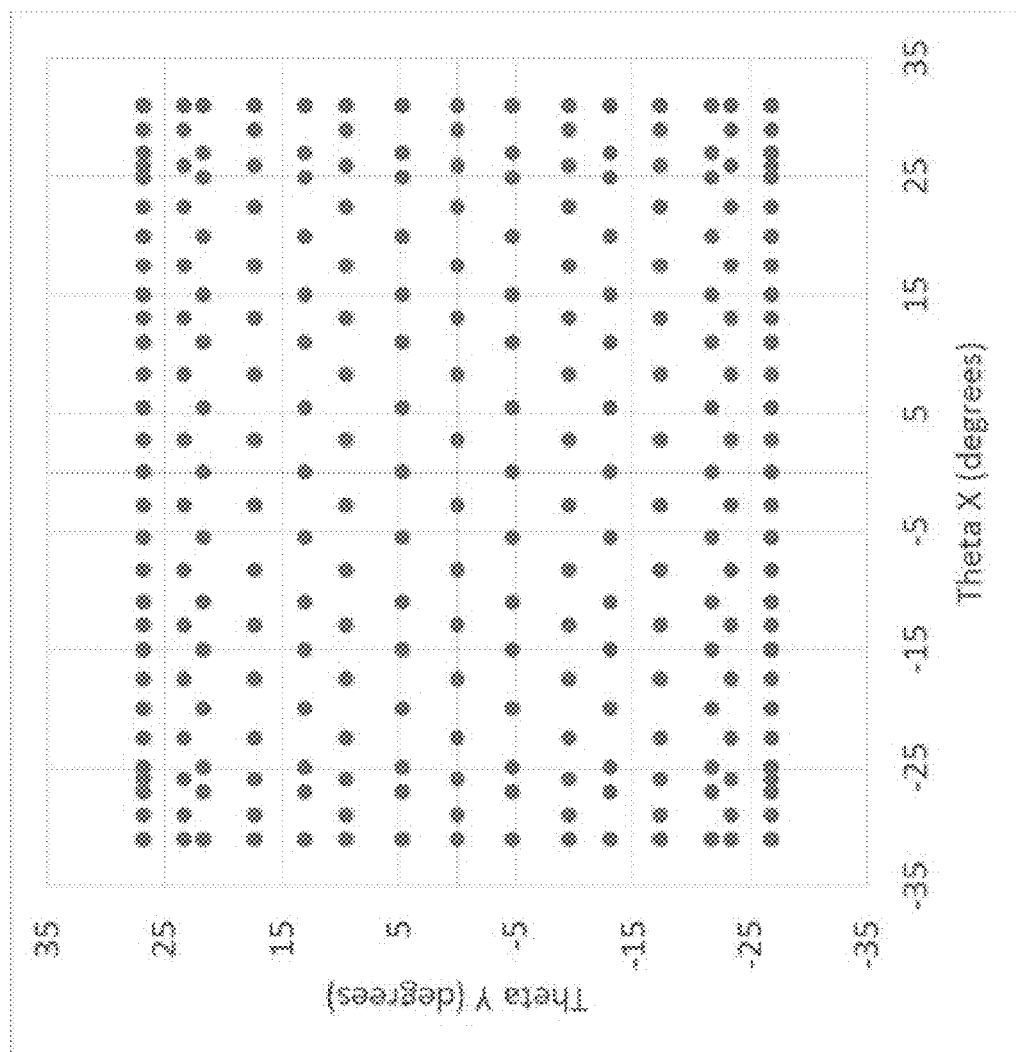
FIG. 5 is a diagram illustrating an example of a distribution of aiming directions of emitters in a two-dimensional emitter array included in the optical device described herein.

Notably, the examples shown in FIGS. 3 and 4 are associated with a 1D emitter array 102, but similar principles may be applied in the case of a 2D emitter array 102. FIG. 5 is a diagram illustrating an example of a distribution of aiming directions of emitters 104 in a 2D emitter array 102 (e.g., an array of 328 emitters 104 is shown in FIG. 5). In some implementations, as shown in FIG. 5, the distribution of aiming directions may have a honeycomb-like pattern (e.g., rather than a square grid) in a center of the far-field (e.g., away from edges of the far-field). In some implementations, the honeycomb-like pattern permits even coverage with the circular far-fields of individual emitters 104. Notably, the honeycomb-like pattern shown in FIG. 5 indicates the distribution of aiming directions of emitters 104 as provided by integrated optical element 106 and does not relate to a spatial distribution of emitters 104. That is, the distribution shown in FIG. 5 does not represent a physical layout of emitters 104 of the emitter array 102.

Figure 6A:
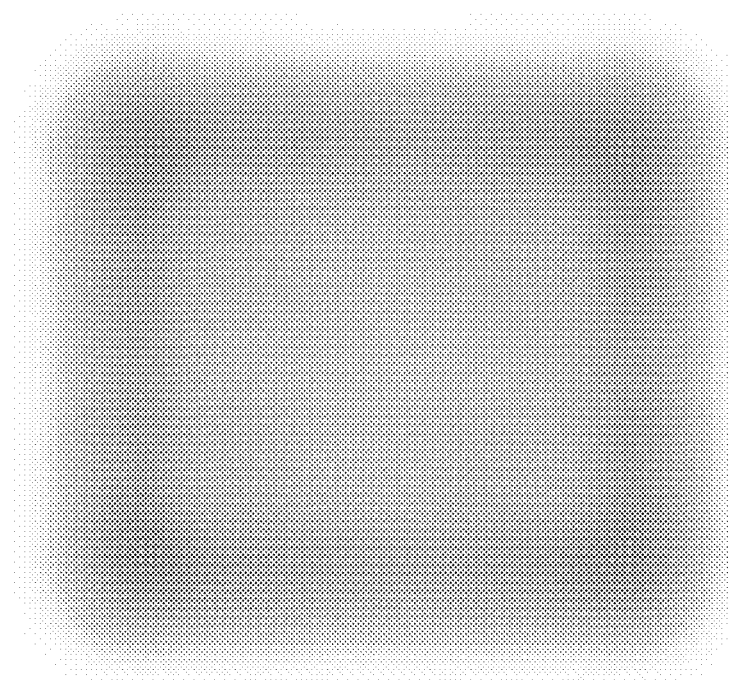
FIGS. 6A-6C are diagrams illustrating distributions of intensity versus angle for the example emitter array associated with the example shown in FIG. 5.
Figure 6B:
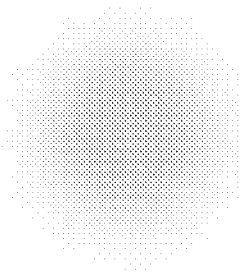
Figure 6C:
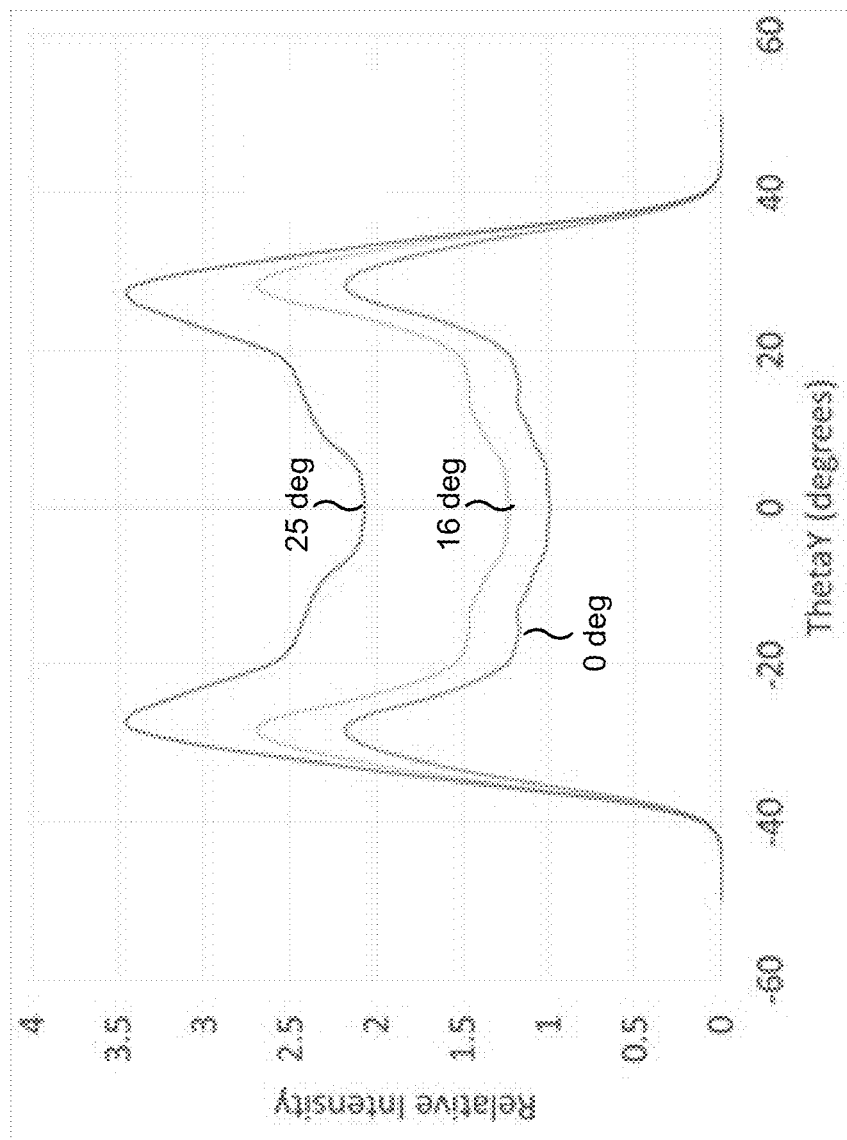

FIGS. 6A-6C are diagrams illustrating distributions of intensity versus angle for the example emitter array 102 associated with FIG. 5. FIG. 6A illustrates a 2D intensity versus angle from all emitters 104 of the 2D emitter array 102. Notably, intensity is higher near edges of the intensity distribution (e.g., as indicated by the comparatively darker region). FIG. 6B illustrates a 2D intensity versus angle for an individual emitter 104 of the 2D emitter array 102 (on the same scale as FIG. 6A). Here, each emitter 104 of the example emitter array 102 would have a similar intensity but would be directed towards a different angle (e.g., a different location in FIGS. 6A, 6B). A composite of the intensities associated with all emitters 104 would result in the distribution shown in FIG. 6A. FIG. 6C illustrates examples of 1D "slices" through the intensity versus angle distribution shown in FIG. 6A along a first axis (the theta Y axis shown in FIG. 5) at various values (e.g., 0 degrees, 16 degrees, and 25 degrees) along a second axis (the theta X axis shown in FIG. 5). As shown by FIGS. 6A-6C, the diffusion pattern created by integrated optical element 106 in the 2D implementation may have a bat-wing profile (e.g., at a given "slice" of the distribution).

Figure 7:
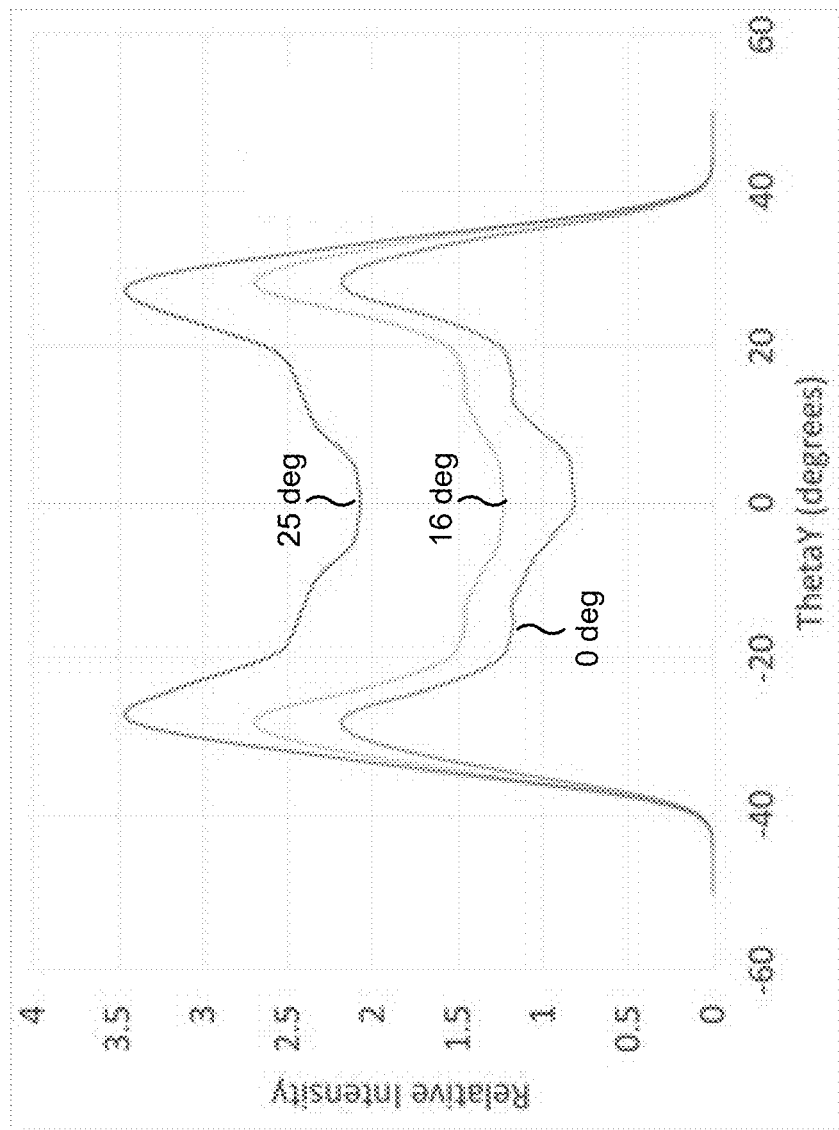
FIG. 7 illustrates examples of one-dimensional slices through the intensity versus angle shown in FIG. 6A in a case when an emitter near a center of the example emitter array is a dead emitter.

One consideration for an integrated optical element 106 is an ability to function even when an emitter 104 has died. A "dead" emitter 104 may be, for example, an emitter 104 that has an amount of power that is less than a threshold, an emitter 104 that has no power, an emitter 104 that has significantly less power than an adjacent emitter 104, and/or the like. FIG. 7 illustrates examples of 1D slices through the intensity versus angle shown in FIG. 6A in a case when an emitter 104 near a center of the example emitter array 102 is a dead emitter. Thus, FIG. 7 illustrates a tolerance of the optical device 100 to a dead emitter 104 being present in the emitter array 102. As indicated in FIG. 7, a dead emitter 104 near the center of the 2D emitter array 102 reduces intensity by only approximately 15%, meaning that optical device 100 may still provide desired functionality in most circumstances. Notably, the example shown in FIG. 7 is an extreme case in which the dead emitter 104 has zero power. In practice, a dead emitter 104 may have some power, meaning that the intensity reduction would in some cases be less severe.

As indicated above, FIGS. 5, 6A-6C, and 7 are provided as examples. Other examples may differ from what is described with regard to FIGS. 5, 6A-6C, and 7.

Figure 8:
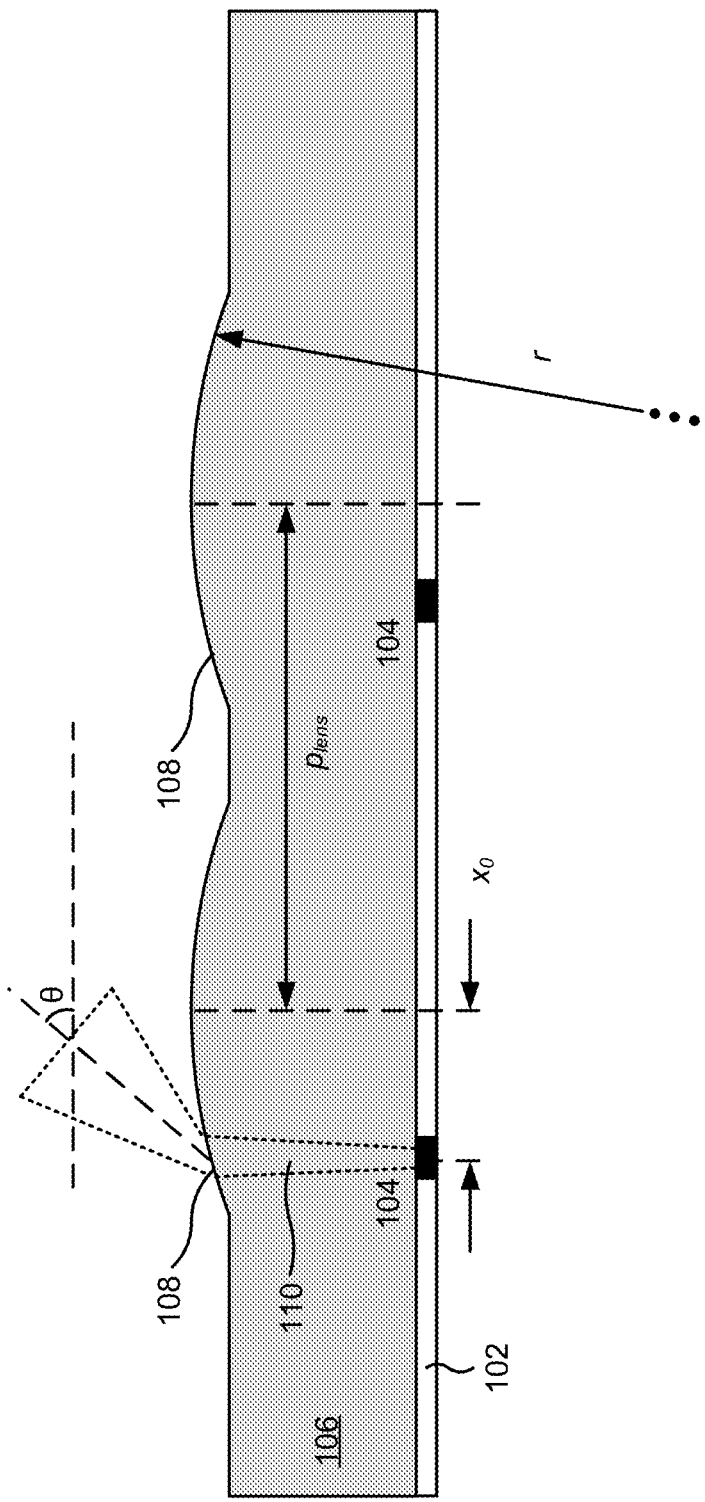
FIG. 8 is a schematic diagram illustrating an example optical device described herein in which the integrated directed beam diffuser comprises lens segments that are entire lenses.

In some implementations, as described above, a surface of a lens segment 108 may be curved to reduce divergence of a beam 110 (e.g., to permit optical power to be better confined within the FOV). FIG. 8 is a schematic diagram illustrating lens segments 108 having radius of curvature r (e.g., formed on a substrate of emitter array 102) through which beams 110 from emitters 104 pass and exit at an angle θ (relative to the horizontal). However, if the curvature is too strong, then a resulting tilt of a beam 110 may be sensitive to errors in an offset from a lens center (illustrated as $x_0$ in FIG. 8). For example, if the alignment tolerance is +/−2 μm, a beam nominally pointing 30 degrees off vertical (normal to the substrate surface) may be as much as +/−2 degrees off for a radius of curvature of 200 μm and the error will increase as the radius of curvature is reduced. Due to limits of the radius of curvature, the size of full (circularly symmetric) lenses can be large as noted above and lens segments are preferred. Further, a tight curvature would lead to a lumpy illuminator. In some implementations, to tolerate misalignment (e.g., an error in $x_0$, not a target value for $x_0$) of up to a few micrometers and to keep the angular profile centered (e.g., within a few degrees), a radius of curvature r may be between approximately 180 μm and approximately 450 μm (e.g., when lens segments 108 are formed in GaAs, which is a common substrate for VCSELs). For a radius of curvature in such a range, the offset $x_0$ from the center of lens segment 108 to beam 110 to tilt the beam by approximately 30 to 40 degrees is in on the order of tens of micrometers. Notably, when a lens segment 108 that is an entire lens (e.g., a radially symmetric lens, as shown in FIG. 8) is used for each emitter 104, an emitter-to-emitter pitch is limited by the pitch between adjacent lenses $p_{lens}$, which may be, for example, 100 μm to 200 μm. Such a limitation may result in a significant amount of space between emitters 104 being wasted and lead to a large and costly die. Thus, in some implementations, a lens segment 108 may be a portion (e.g., a few percent) of the area of an entire lens. Using such lens segments 108 may therefore reduce a size and cost of optical device 100.

Figure 9:
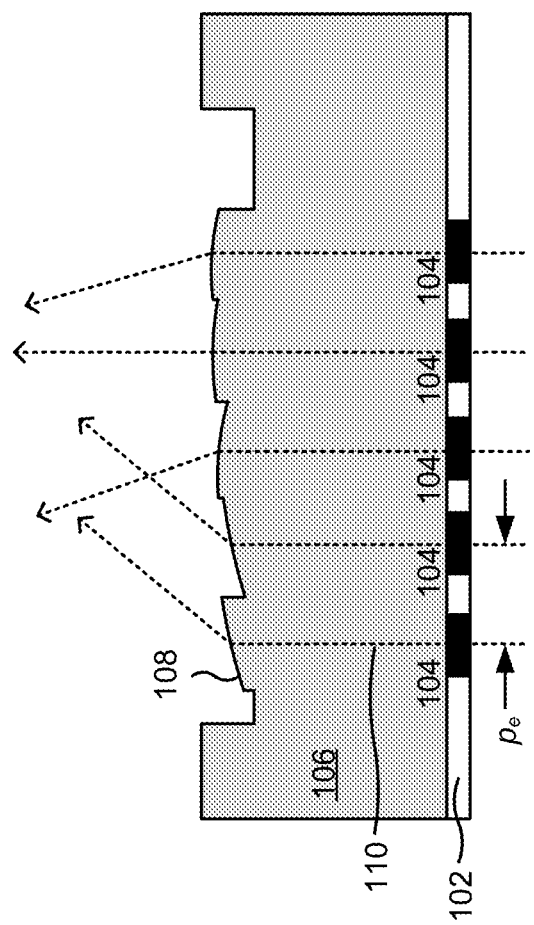
FIG. 9 is a schematic diagram illustrating an example optical device described herein in which the integrated directed beam diffuser comprises lens segments that are portions of lenses.

FIG. 9 is a schematic diagram illustrating an example optical device 100 including lens segments 108 that are portions of lenses (e.g., segments of radially symmetric lenses, rather than entire radially symmetric lenses). In the example shown in FIG. 9, each emitter 104 is arranged under a lens segment 108 to direct a beam 110 and partially reduce beam divergence. Here, the lens segments 108 enable the pitch $p_e$ between emitters 104 to be limited by a size of the beams 110 at the lens segments 108 rather than a size of the entire lens. Notably, because emitter array 102 is typically relatively small (e.g., having a size of approximately 1 millimeter (mm)) in comparison to the scene being illuminated by optical device 100 (e.g., which may have a size on the order of hundreds of mm to a few meters (m)), a spatial location of emitters 104 on a chip does not change an observed intensity versus angle. Accordingly, lens segments 108 may be spatially rearranged in any order. In some implementations, the spatial configuration of lens segments 108 is configured to improve manufacturability (e.g. yield and reproducibility) of the integrated optical element 106. In some implementations, the spatial configuration of lens segments 108 is configured to reduce the frequency or height of transitions between adjacent lens segments. In some implementations, the spatial configuration of lens segments 108 is configured to reduce power loss effects from potential failure modalities (e.g. adjacent emitter failures, edge failures, crystallographic dislocations, etc.) As further shown in FIG. 9, in some implementations, lens segments 108 are recessed from a top surface of integrated optical element 106 by a standoff at a perimeter of an emission area of optical device 100 (e.g., an edge of the die). Here, lens segments 108 being recessed from the top surface by the standoffs may serve to protect surfaces of lens segments 108 from damage.

As indicated above, FIGS. 8 and 9 are provided as examples. Other examples may differ from what is described with regard to FIGS. 8 and 9.

Figure 10:
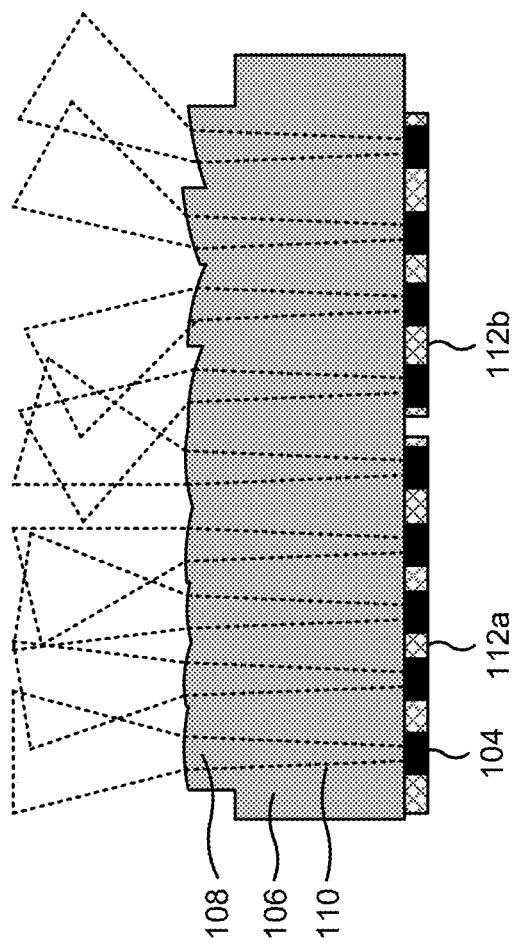
FIG. 10 is diagram illustrating an example of an alternative design for an integrated directed beam diffuser that provides the same intensity versus angle profile as that provided by the integrated directed beam diffuser shown in the optical device of FIG. 1.

In practice, different designs for lens segments 108 of integrated optical element 106 can be used to provide the same intensity versus angle profile. For example, the design for lens segments 108 of integrated optical element 106 shown in FIG. 10 may provide the same intensity versus angle profile as that provided by lens segments 108 of integrated optical element 106 shown in FIG. 1. Notably, FIG. 10 is diagram illustrating an example of an alternative design that provides the same intensity versus angle profile as that provided by the integrated directed beam diffuser shown in the optical device of FIG. 1 when both electrodes are energized. When either one of the two electrodes is energized, the central or the exterior portions of the intensity profile vs angle is illuminated. Notably, the design shown in FIG. 1 causes beams 110 nearer to edges of emitter array 102 to be tilted comparatively more than beams 110 nearer to the center of emitter array 102. In comparison, the design shown in FIG. 10 causes beams 110 on a left side of emitter array 102 to be tilted comparatively less than and beams 110 on a right side of emitter array 102.

In some implementations, beams 110 with the comparatively less tilt may be grouped under one contact of emitter array 102, while beams 110 with comparatively more tilt may be grouped under another contact (e.g., a separate anode or cathode) of emitter array 102. That is, in some implementations, a first set of emitters 104 of emitter array 102 is connected to a first contact 112a of optical device 100 and a second set of emitters 104 of emitter array 102 is connected to a second contact 112b of optical device 100, as illustrated in FIG. 10. In such a case, as further illustrated in FIG. 10, integrated optical element 106 may be designed to steer beams 110 from the first set of emitters 104 toward a center of the diffusion pattern and may steer beams 110 from the second set of emitters 104 toward one or more edges of the diffusion pattern. In some implementations, one or more emitters 104 in the first set of emitters 104 are at an edge of emitter array 102 and one or more emitters 104 in the second set of emitters 104 are at an edge of emitter array 102, which improves addressability of the sets of emitters 104.

Figure 11:
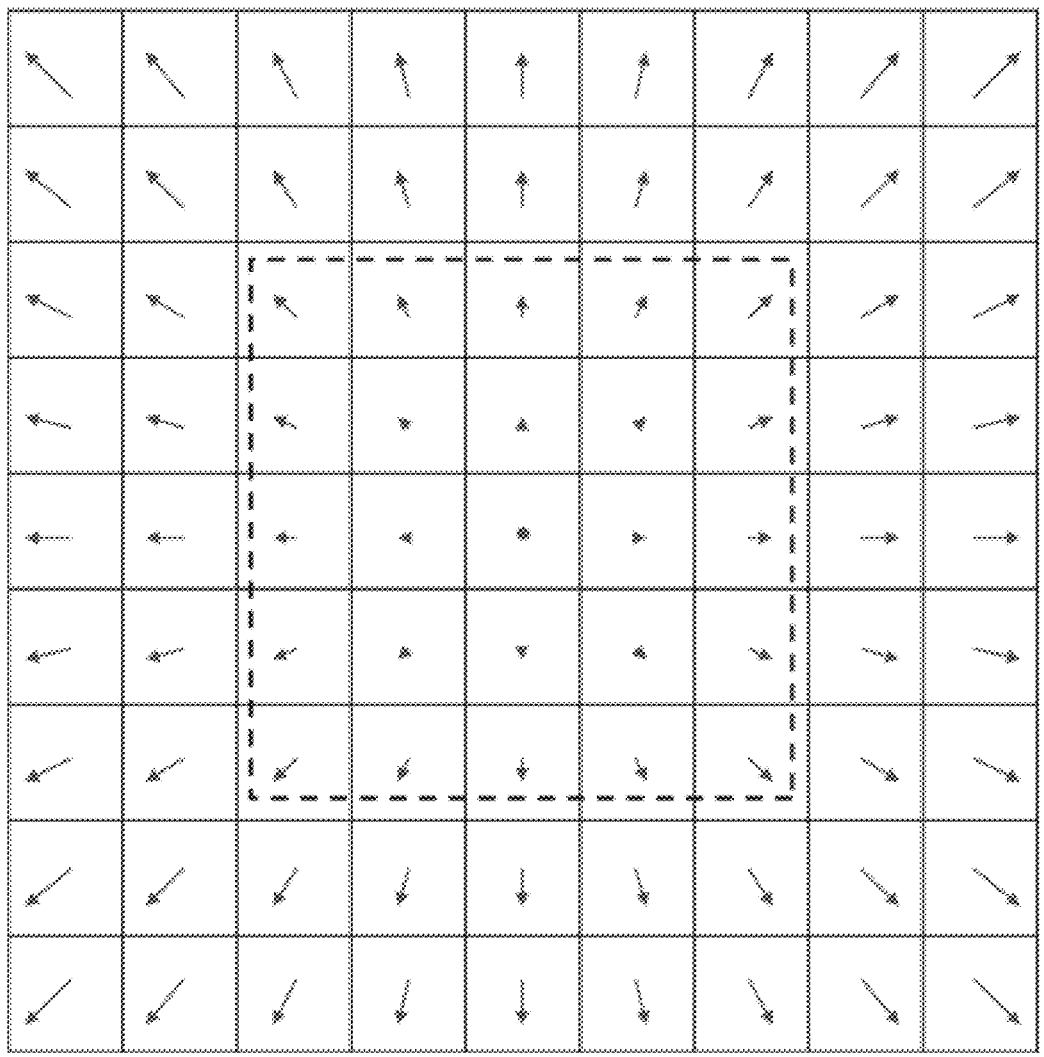
FIGS. 11 and 12 are diagrams illustrating examples of simplified two-dimensional layouts for beam steering provided by the integrated directed beam diffuser described herein.

FIG. 11 is a diagram illustrating an example of a simplified 2D spatial layout (e.g., a 9×9 layout) for beam steering provided by integrated optical element 106. In FIG. 11, each emitter 104 of emitter array 102 is represented by a box, and an associated arrow indicates a direction of tilt provided by integrated optical element 106 (as observed from directly above integrated optical element 106). The dot in the center box represents a beam 110 pointing directly out of a plane of FIG. 11. In FIG. 11, lens segments 108 nearer to a center of emitter array 102 provide comparatively less tilt than lens segments 108 nearer to edges of emitter array 102. This design is consistent with the design for integrated optical element 106 shown in FIG. 1.

Figure 12:
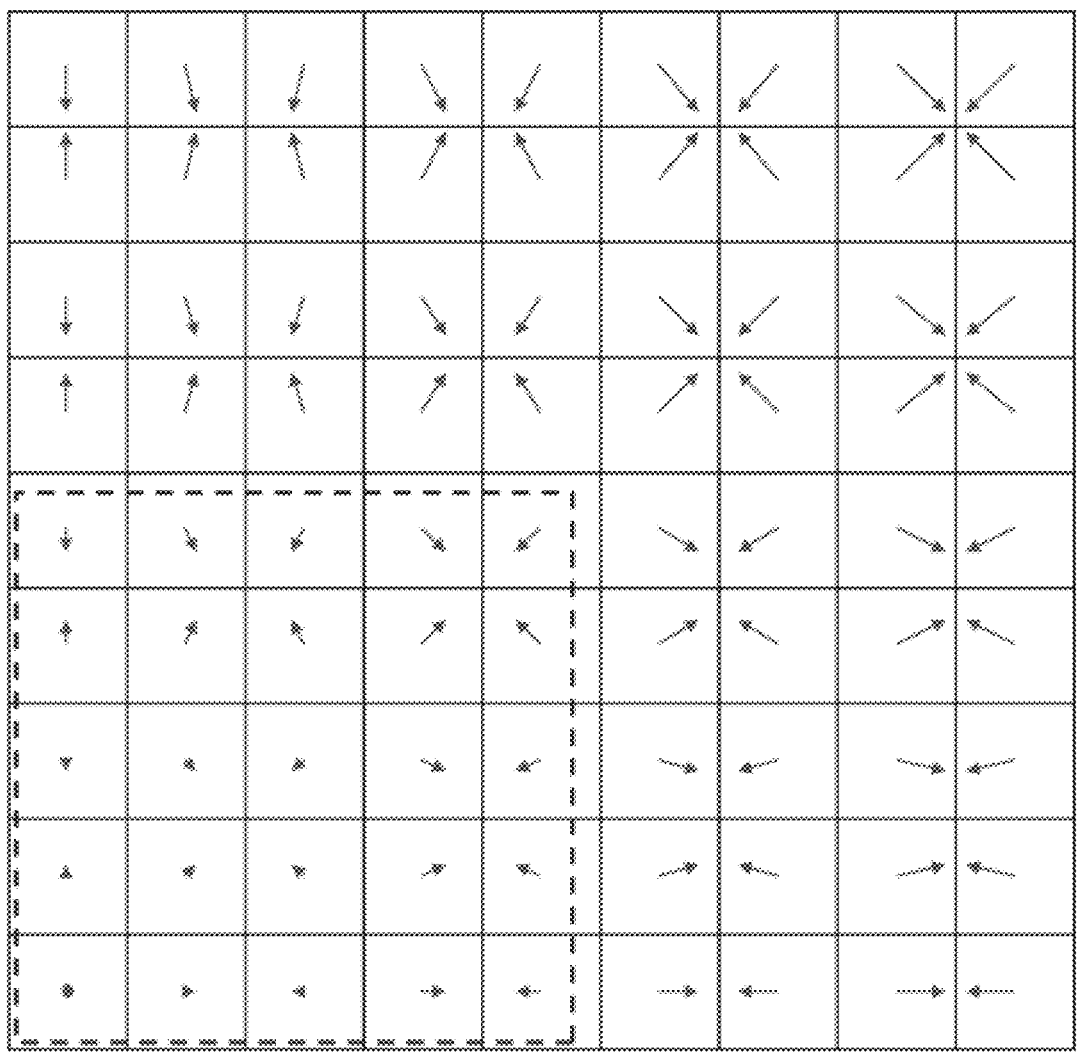

An alternative layout is shown in FIG. 12. In FIG. 12, lens segments 108 are arranged such that beams 110 with comparatively less tilt are nearer to a corner of emitter array 102 (e.g., the top left corner of emitter array 102), rather than being nearer to the center of emitter array 102 as in the case of FIG. 11. One advantage of the design of integrated optical element 106 associated with FIG. 12 is that addressing beams 110 being directed nearer to the center of the FOV is simplified as compared to doing so in FIG. 11 (e.g., since emitters 104 aimed nearer to the center of the FOV are at an edge of emitter array 102). For example, optical device 100 may be flip-chip mounted on a submount, and traces going to an edge of optical device 100 can be routed on a single plane of the submount. Conversely, in the design shown in FIG. 11, either optical device 100 requires traces that overlap to separately access emitters 104 nearer to the center, or the submount needs traces or vias—either of which adds cost and complexity to either optical device 100 or the submount. Another possible arrangement (not shown) is to arrange lens segments 108 such that emitters 104 being aimed nearer to the center of the FOV are in multiple locations along a perimeter (e.g., at corners) of emitter array 102. In such an arrangement, failures of multiple adjacent emitters 104 may not result in a significant loss of functionality (e.g., since not all emitters 104 being aimed nearer to the center would be clustered together). Notably, the layouts in FIGS. 11 and 12 may be used to illuminate the FOV or sub-sections of the FOV.

Figure 13:
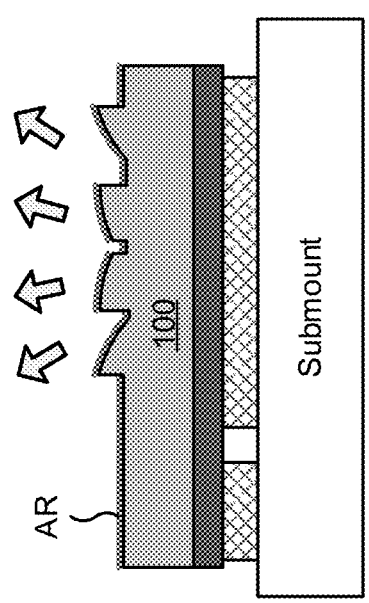
FIG. 13 is a diagram illustrating a flip-chip mounted optical device including the integrated directed beam diffuser described herein.

FIG. 13 is a diagram illustrating a flip-chip mounted optical device 100 including integrated optical element 106. In some implementations, as shown in FIG. 13, an AR coating is formed on a top surface of optical device 100 to reduce reflection by the top surface of optical device 100.

As indicated above, FIGS. 10-13 are provided as examples. Other examples may differ from what is described with regard to FIGS. 10-13.

The integrated optical element 106 described above is comparatively more efficient than a conventional (discrete) diffuser. For example, a given beam 110 may be reduced in divergence to produce sharper edges of intensity versus angle profile, thereby improving FOV efficiency (e.g., by approximately 7%). Further, an AR coating can be more readily formed and kept on optical device 100 (e.g., as compared to the conventional diffuser). Conventional diffusers are commonly a polymer attached to glass and stamped to form the refractive pattern. Typically, an AR coating is a thin film of a dielectric material like a metal oxide or glass or a multi-layer stack of metal oxides or glasses of thickness comparable to the wavelength (fractions of a micrometer). Such thin dielectric films do not adhere well to polymers which may stretch much faster with temperature and crack the film. But AR coating materials are compatible with semiconductors. The reduction in reflection provided by the AR coating can provide a further increase in the efficiency (e.g., by approximately 4% to 8% depending if a conventional diffuser has the glass substrate side coated). Notably, there may be some (e.g., approximately 3%) absorption from the substrate. However, the overall improvement in efficiency even with such absorption may be significant (e.g., approximately 12%).

In some implementations, the arrangement of lens segments 108 can be selected so as at to simplify fabrication of optical device 100. For example, the arrangement of lens segments 108 can be selected so as to reduce or eliminate abrupt changes in the profile of lens segments 108 on integrated optical element 106. FIGS. 14A and 14B are diagrams illustrating an example arrangement of lens segments 108 that reduces abrupt changes in a profile of lens segments 108 on integrated optical element 106 (e.g., as compared to the design shown in FIG. 1). Notably, in the design shown in FIG. 1, a transition between a given pair of adjacent lens segments 108 (most easily seen at the left-most and right-most ends of the integrated optical element 106) is a vertical step. In some implementations, to ease fabrication, the arrangement of lens segments 108 may be selected as shown in FIG. 14A so that, for example, beams 110 on the two adjacent lens segments 108 on the left-most side of integrated optical element 106 are directed in generally opposite directions (e.g., a leftward direction and a rightward direction), rather than both being directed in generally the same direction (e.g., leftward, as in the design shown in FIG. 1). Similarly, beams 110 on the two adjacent lens segments 108 on the right-most side of integrated optical element 106 are directed in generally opposite directions (e.g., a leftward direction and a rightward direction), rather than both being directed in generally the same direction (e.g., rightward, as in the design shown in FIG. 1). Here, by comparing FIGS. 14A and 1, it can be seen that the abrupt step between these adjacent lens segments is not present in the integrated optical element 106 with such an arrangement, thereby simplifying fabrication of optical device 100 (e.g., because of abrupt changes in the profile of integrated optical element 106 may be difficult to manufacture).

Thus, in some implementations, surfaces of lens segments 108 may be sloped in alternating directions to cause beams 110 from emitters 104 of the emitter array 102 to be steered at alternating angles with respect to a surface of the emitter array 102. Put another way, in some implementations, surfaces of two adjacent lens segments 108 may be sloped to cause beams 110 from two emitters 104 of the emitter array 102 to be steered at angles having opposite directions with respect to a surface of the emitter array 102. As a particular example, a surface of a first lens segment 108 may be sloped to cause a beam 110 from a first emitter 104 of the to be steered at a first angle, and a surface of a second lens segment 108 may be sloped to cause a beam 110 from a second emitter 104 to be steered at a second angle. In this example, the second lens segment 108 is adjacent to the first lens segment 108, and a direction of the second angle with respect to a surface of the emitter array 102 is opposite to a direction of the first angle with respect to the surface of the emitter array 102.

Additionally, as illustrated in FIG. 14B, in some implementations, transitions between regions where beams 110 exit (e.g., regions near edges of lens segments 108 where beams 110 are not incident) may be smoothed so that abrupt profile changes between lens segments 108 are further reduced. Because such regions do not have an optical function, these regions may be adjusted as suitable for fabrication requirements. As further shown in FIG. 14B, in some implementations, a transition to a higher plateau outside of lens segments 108 may also be smoothed. Notably, the illustrations shown in FIGS. 14A and 14B are for a 1D design, but these techniques can be similarly applied in a 2D design. In some implementations, by arranging lens segments 108 to reduce steps and smoothing the profile of the integrated optical element 106, more compact emitter designs are enabled (e.g., as compared to a design without such arrangement or smoothing that will require comparatively more die area for step transitions). Notably, such arrangement may not be needed for angle changes that are relatively are small (e.g., +/−5 degrees), as abrupt steps may not be present in the profile of integrated optical element 106 in these regions.

As indicated above, FIGS. 14A and 14B are provided as examples. Other examples may differ from what is described with regard to FIGS. 14A and 14B.

In some implementations, emitters 104 in an emitter array 102 may be connected in groups that change sequentially across the emitter array 102. Such a configuration may be used, for example, to enable a scene to be scanned from negative to positive angles.

Figure 15:
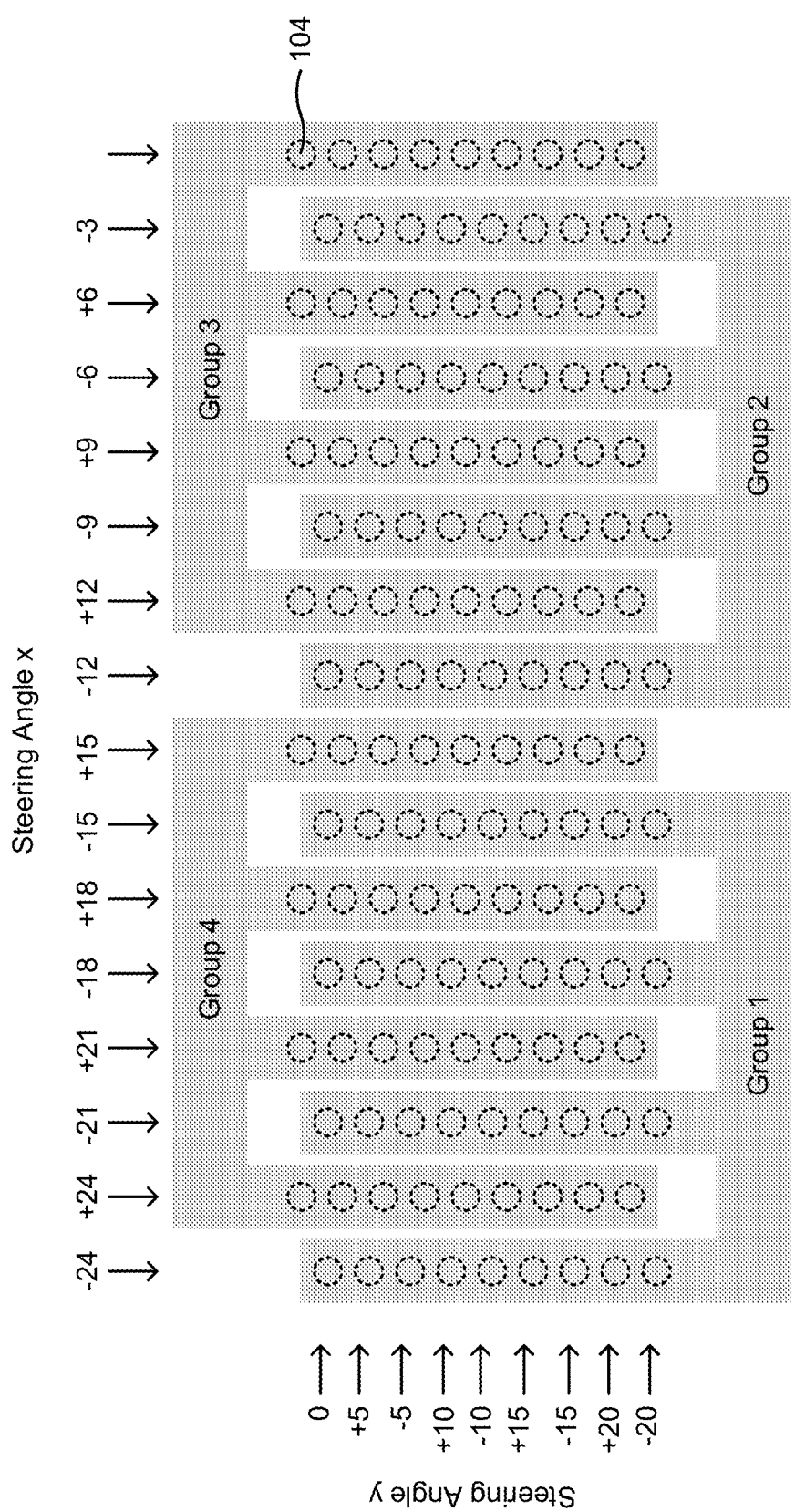
FIGS. 15 and 16 are diagrams illustrating an example optical device in which emitters of an emitter array 102 are connected in groups that change sequentially across the emitter array.

FIG. 15 is a diagram illustrating an example optical device 100 in which emitters 104 of 2D emitter array 102 are connected in groups that change sequentially across emitter array 102. In FIG. 15, emitter steering angle in the x-direction is indicated along the top of optical device 100. As shown, steering angle in the x-direction alternates between negative angles and positive angles so as to minimize vertical transitions in the profile of integrated optical element 106, as described above. Further, emitter steering angle in the y-direction is indicated along the left side of optical device 100. As shown, steering angle in the y-direction alternates between negative angles and positive angles so as to minimize vertical transitions in the profile of integrated optical element 106, as described above. In the example shown in FIG. 15, emitters 104 are connected by a first metal layer (shown in gray) to form four groups that span steering angles from −24 degrees to −15 degrees (Group 1), −12 degrees to −3 degrees (Group 2), +3 degrees to +12 degrees (Group 3), and +15 degrees to +24 degrees (Group 4). Thus, in some implementations, emitters 104 in the emitter array 102 may be connected such that steering angles provided by the plurality of lens segments 108 change sequentially in a particular direction (e.g., the x-direction and/or the y-direction) across the emitter array 102.

Figure 16:
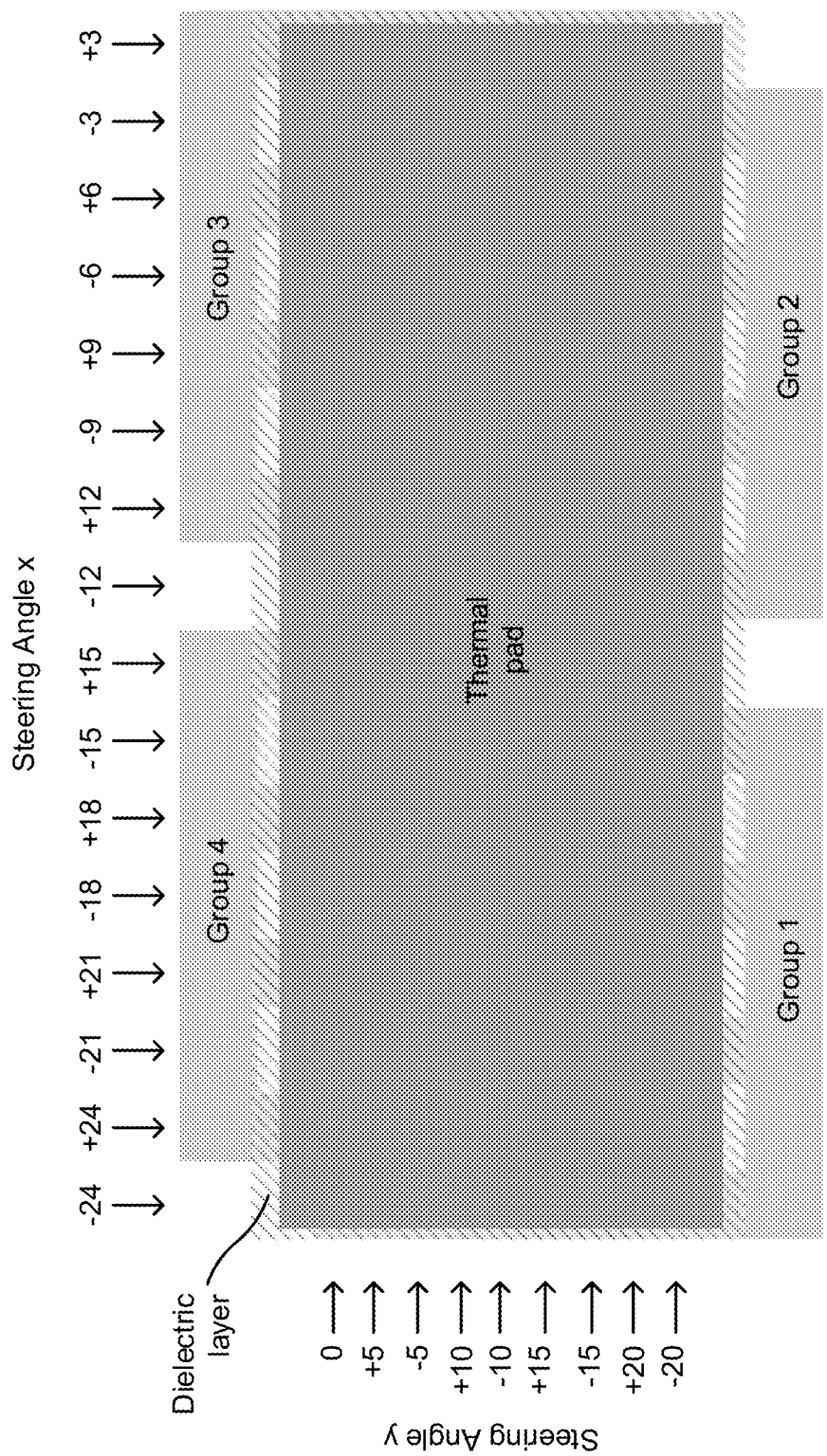

In some implementations, the optical device 100 shown in FIG. 15 may include a second metal layer to provide a thermal pad, an example of which is shown in FIG. 16. In some implementations, as shown in FIG. 16, the second metal layer may be formed over a dielectric layer (e.g., to prevent adjacent groups of emitters 104 from shorting together). In some implementations, such a design enables flip-chip bonding to a submount and connections to a driver.

Figure 17:
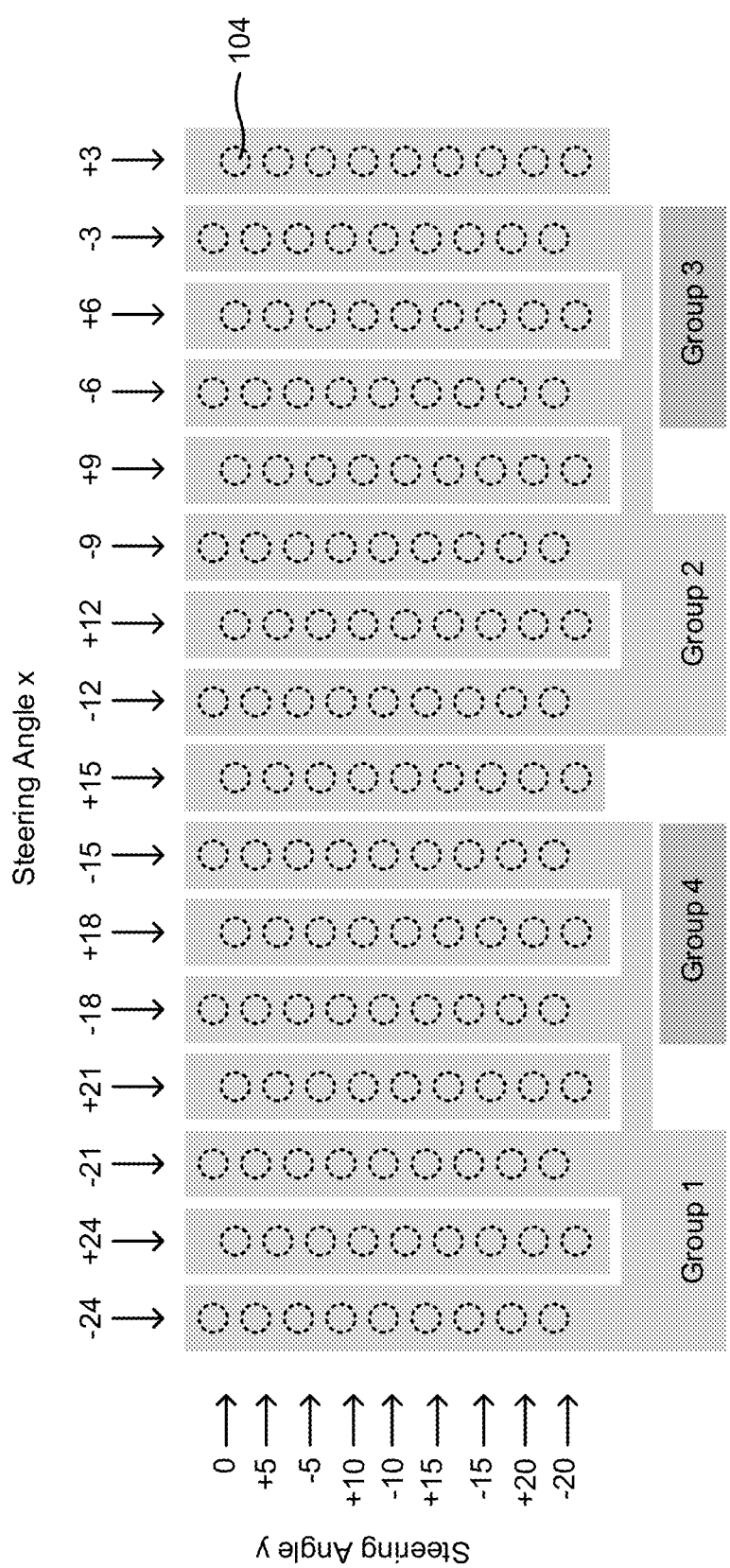
FIGS. 17 and 18 are diagrams illustrating an example optical device in which connections for groups of emitters are on one side of the optical device.

In some implementations, optical device 100 may be designed such that connections for groups of emitters 104 are arranged on one side of optical device 100. In some implementations, such an arrangement may enable, for example, driver connections on only one side of optical device 100. FIG. 17 is a diagram illustrating an example optical device 100 in which connections for groups of emitters 104 are on one side of optical device 100. In FIG. 17, emitter steering angle in the x-direction is indicated along the top of optical device 100. As shown, steering angle in the x-direction alternates between negative angles and positive angles so as to minimize vertical transitions in the profile of integrated optical element 106, as described above. Further, emitter steering angle in the y-direction is indicated along the left side of optical device 100. As shown, steering angle in the y-direction alternates between negative angles and positive angles so as to minimize vertical transitions in the profile of integrated optical element 106, as described above. In the example shown in FIG. 17, emitters 104 are connected by a first metal layer (shown in gray) in association forming four groups that span steering angles from −24 degrees to −15 degrees (Group 1), −12 degrees to −3 degrees (Group 2), +3 degrees to +12 degrees (Group 3), and +15 degrees to +24 degrees (Group 4).

Figure 18:
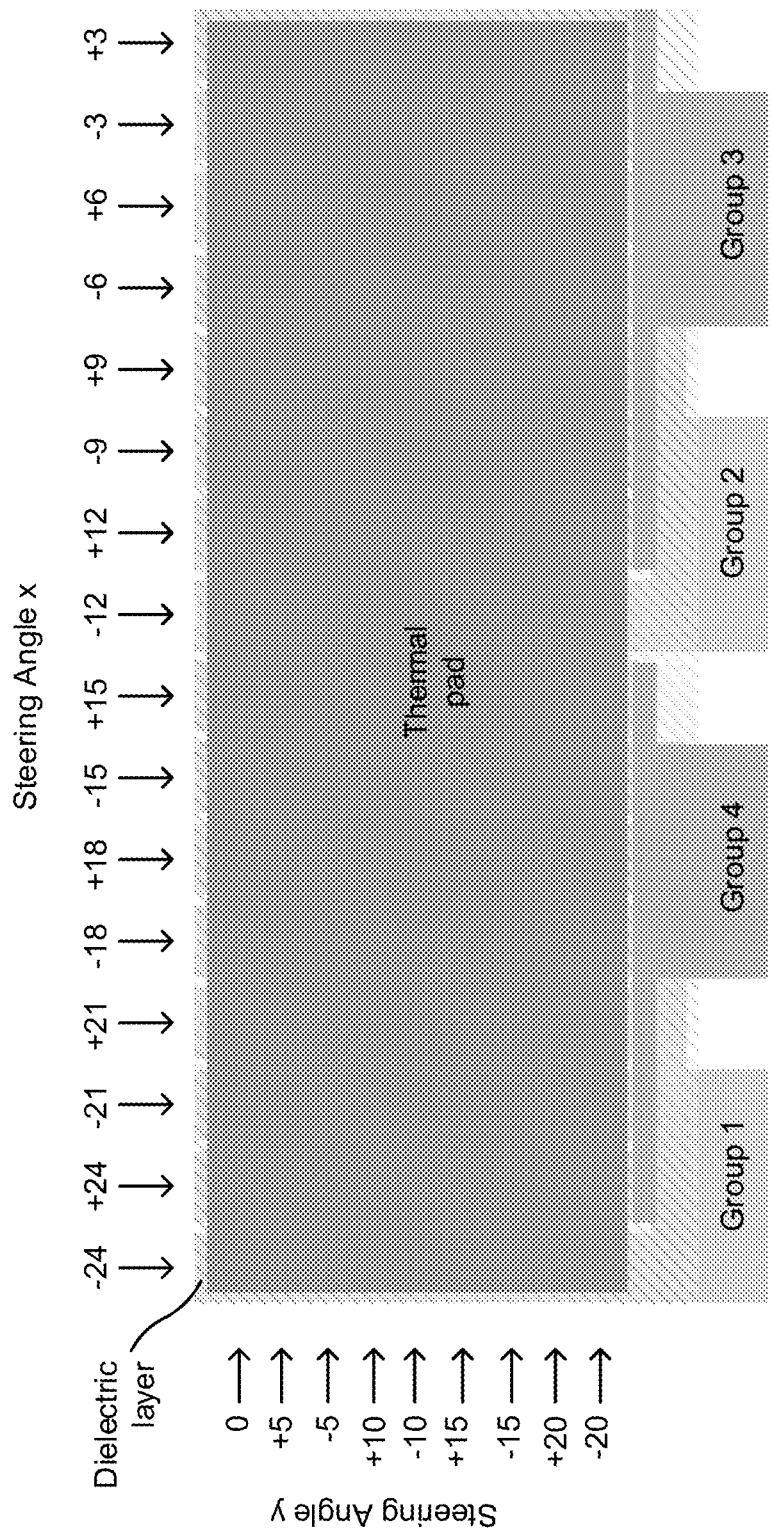

As shown in FIG. 17, the first metal layer may be formed so as to provide electrical connections for all four groups from one side of optical device 100. Notably, in the example shown in FIG. 17 connections to Groups 1 and 2 are fully formed on the first metal layer, while connections to Groups 3 and 4 are only partially formed the first metal layer. In this example, connections for Groups 3 and 4 are completed on a second metal layer, which is illustrated in FIG. 18. In some implementations, as further shown in FIG. 18, the second metal layer may further provide a thermal pad for optical device 100. In some implementations, as shown in FIG. 18, the second metal layer may be formed over a dielectric layer (e.g., to prevent adjacent groups of emitters 104 from shorting together). Here the dielectric layer includes vias to permit connections to Groups 3 and 4 to be completed. In some implementations, such a design enables flip-chip bonding to a submount and connections to a driver.

As indicated above, FIGS. 15-18 are provided as examples. Other examples may differ from what is described with regard to FIGS. 15-18.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A bottom-emitting vertical-cavity surface-emitting laser (VCSEL) chip, comprising:
   a VCSEL array including plurality of VCSELs; and
   an integrated optical element having a first side edge, a second side edge, and a front edge extending between the first side edge and the second side edge, the integrated optical element including a plurality of lens segments arranged along the front edge,
   wherein the integrated optical element is to direct beams provided by the plurality of VCSELs to a particular range of angles to create a diffusion pattern using the beams provided by the plurality of VCSELs,
   wherein a first lens segment of the plurality of lens segments is adjacent to the first side edge of the integrated optical element,
   wherein a surface of the first lens segment is sloped to cause a beam from a first VCSEL of the plurality of VCSELs to be steered at a first angle away from a center of the VCSEL array,
   wherein a second lens segment of the plurality of lens segments is adjacent to the first lens segment,
   wherein a surface of a second lens segment is sloped to cause a beam from a second VCSEL of the plurality of VCSELs to be steered at a second angle toward the center of the VCSEL array,
   wherein a third lens segment of the plurality of lens segments is adjacent to the second lens segment, wherein a surface of the third lens segment is sloped to cause a beam from a third VCSEL of the plurality of VCSELs to be steered at a third angle away from the center of the VCSEL array, and
wherein a beam from a VCSEL of the plurality of VCSELs is to pass through only one lens segment of the plurality of lens segments.

2. The bottom-emitting VCSEL chip of claim 1, wherein a lens segment of the plurality of lens segments is to steer a beam from a VCSEL of the plurality of VCSELs at a respective particular angle in association with creating the diffusion pattern.

3. The bottom-emitting VCSEL chip of claim 1, wherein light from a VCSEL of the plurality of VCSELs is present in a portion of the diffusion pattern that is less than an entirety of the diffusion pattern.

4. The bottom-emitting VCSEL chip of claim 1, wherein an aggregate intensity versus angular distribution of the diffusion pattern has a bat-wing profile within a field-of-view associated with the diffusion pattern.

5. The bottom-emitting VCSEL chip of claim 1, wherein a lens segment of the plurality of lens segments is to reduce a beam divergence of a beam from a VCSEL of the plurality of VCSELs.

6. The bottom-emitting VCSEL chip of claim 1, wherein a radius of curvature of each lens segment of the plurality of lens segments is in a range from approximately 180 micrometers (μm) to approximately 450 μm.

7. The bottom-emitting VCSEL chip of claim 1, wherein a transition between the first lens segment and the second lens segment is smoothed.

8. The bottom-emitting VCSEL chip of claim 1, wherein VCSELs in the plurality of VCSELs are connected such that steering angles provided by the plurality of lens segments change sequentially across the VCSEL array in a particular direction.

9. The bottom-emitting VCSEL chip of claim 8, wherein the steering angles provided by the plurality of lens segments alternate between negative and positive angles across the VCSEL array in the particular direction.

10. The bottom-emitting VCSEL chip of claim 1, wherein a size of a footprint of the integrated optical element matches or is smaller than a size of a footprint of the bottom-emitting VCSEL array chip.

11. The bottom-emitting VCSEL chip of claim 1, wherein a pitch between a first lens segment of the plurality of lens segments and a second lens segment of the plurality of lens segments is in a range from approximately 30 micrometers (μm) to approximately 60 μm.

12. An optical device, comprising:
a vertical-cavity surface-emitting laser (VCSEL) array including plurality of VCSELs; and
an integrated optical element having a first side edge, a second side edge, and a front edge extending between the first side edge and the second side edge, the integrated optical element including a plurality of lens segments arranged along the front edge,
wherein the integrated optical element is to direct beams provided by the plurality of VCSELs to a particular range of angles to create a diffusion pattern using the beams provided by the plurality of VCSELs,
wherein a lens segment of the plurality of lens segments is to steer a beam from a VCSEL of the plurality of VCSELs at a respective particular angle in association with creating the diffusion pattern,
wherein a first lens segment of the plurality of lens segments is adjacent to the first side edge of the integrated optical element,
wherein a second lens segment of the plurality of lens segments is adjacent to the first lens segment,
wherein a third lens segment of the plurality of lens segments is adjacent to the second lens segment,
wherein a fourth lens segment of the plurality of lens segments is adjacent to the third lens segment,
wherein surfaces of the first lens segment and the second lens segment are sloped to cause beams from two respective VCSELs of the plurality of VCSELs to be steered at angles having opposite directions with respect to a surface of the VCSEL array such that:
one of the beams, that corresponds to the first lens segment, extends away from a center of the VCSEL array, and
another of the beams, that corresponds to the second lens segment, extends toward the center of the VCSEL array,
wherein surfaces of the third lens segment and the fourth lens segment are sloped to cause beams from two respective VCSELs of the plurality of VCSELs to be steered at angles having a substantially same direction with respect to a surface of the VCSEL array such that:
the beams, that correspond to the third lens segment and the fourth lens segment, extend away from the center of the VCSEL array.

13. The optical device of claim 12, wherein light from a VCSEL of the plurality of VCSELs is present in a portion of the diffusion pattern that is less than an entirety of the diffusion pattern.

14. The optical device of claim 12, wherein VCSELs in the plurality of VCSELs are connected such that steering angles provided by the plurality of lens segments change sequentially across the VCSEL array in a particular direction.

15. The optical device of claim 14, wherein the steering angles provided by the plurality of lens segments alternate between negative and positive angles across the VCSEL array in the particular direction.

16. The optical device of claim 12, wherein a third lens segment of the plurality of lens segments is adjacent to the second side edge of the integrated optical element,
wherein a fourth lens segment of the plurality of lens segments is adjacent to the third lens segment, and
wherein surfaces of the third lens segment and the fourth lens segment are sloped to cause beams from two respective VCSELs of the plurality of VCSELs to be steered at angles having opposite directions with respect to a surface of the VCSEL array.

17. An optical device, comprising:
a vertical-cavity surface-emitting laser (VCSEL) array including plurality of VCSELs; and
an integrated optical element having a first side edge, a second side edge, and a front edge extending between the first side edge and the second side edge, the integrated optical element including a plurality of lens segments arranged along the front edge,
wherein the integrated optical element is to direct beams provided by the plurality of VCSELs to a particular range of angles to create a diffusion pattern using the beams provided by the plurality of VCSELs, wherein light from a VCSEL of the plurality of VCSELs is present in a portion of the diffusion pattern that is less than an entirety of the diffusion pattern, wherein a first lens segment of the plurality of lens segments is adjacent to the first side edge of the integrated optical element, wherein a second lens segment of the plurality of lens segments is adjacent to the first lens segment, wherein a third lens segment of the plurality of lens segments is adjacent to the second lens segment, wherein a fourth lens segment of the plurality of lens segments is adjacent to the third lens segment, wherein surfaces of the first lens segment and the second lens segment are sloped to cause beams from respective VCSELs of the plurality of VCSELs to be steered at angles having opposite directions with respect to a surface of the VCSEL array such that:
  one of the beams, that corresponds to the first lens segment, extends away from a center of the VCSEL array, and
  another of the beams, that corresponds to the second lens segment, extends toward the center of the VCSEL array, wherein surfaces of the third lens segment and the fourth lens segment are sloped to cause beams from two respective VCSELs of the plurality of VCSELs to be steered at angles having a substantially same direction with respect to a surface of the VCSEL array such that:
  the beams, that correspond to the third lens segment and the fourth lens segment, extend away from the center of the VCSEL array.

18. The optical device of claim 17, wherein VCSELs in the plurality of VCSELs are connected such that steering angles provided by the plurality of lens segments change sequentially across the VCSEL array in a particular direction.

19. The optical device of claim 18, wherein the steering angles provided by the plurality of lens segments alternate between negative and positive angles across the VCSEL array in the particular direction.

20. The optical device of claim 17, wherein a third lens segment of the plurality of lens segments is adjacent to the second side edge of the integrated optical element,
  wherein a fourth lens segment of the plurality of lens segments is adjacent to the third lens segment, and
  wherein surfaces of the third lens segment and the fourth lens segment are sloped to cause beams from respective VCSELs of the plurality of VCSELs to be steered at angles having opposite directions with respect to a surface of the VCSEL array.

* * * * *